United States Patent
Kojo

(10) Patent No.: US 10,601,393 B2
(45) Date of Patent: Mar. 24, 2020

(54) CRYSTAL RESONATOR PLATE AND CRYSTAL RESONATOR DEVICE

(71) Applicant: Daishinku Corporation, Kakogawa-shi, Hyogo (JP)

(72) Inventor: Takuya Kojo, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 367 days.

(21) Appl. No.: 15/546,004

(22) PCT Filed: Oct. 30, 2015

(86) PCT No.: PCT/JP2015/080667
§ 371 (c)(1),
(2) Date: Jul. 24, 2017

(87) PCT Pub. No.: WO2016/121182
PCT Pub. Date: Aug. 4, 2016

(65) Prior Publication Data
US 2018/0006630 A1 Jan. 4, 2018

(30) Foreign Application Priority Data
Jan. 29, 2015 (JP) ................. 2015-015784

(51) Int. Cl.
*H03H 9/17* (2006.01)
*H03H 9/05* (2006.01)
*H03H 9/19* (2006.01)
*H03H 9/02* (2006.01)

(52) U.S. Cl.
CPC ............ *H03H 9/0595* (2013.01); *H03H 9/02* (2013.01); *H03H 9/17* (2013.01); *H03H 9/19* (2013.01)

(58) Field of Classification Search
CPC ............................... H03H 9/0595; H03H 9/17
See application file for complete search history.

(56) References Cited

U.S. PATENT DOCUMENTS

| | | | |
|---|---|---|---|
| 6,191,524 B1 * | 2/2001 | Sasaki | H03H 9/02133 310/367 |
| 8,476,811 B2 * | 7/2013 | Mizusawa | H03H 9/1035 310/348 |
| 2005/0231078 A1 * | 10/2005 | Tanaka | H03H 9/02086 310/333 |

(Continued)

FOREIGN PATENT DOCUMENTS

| | | |
|---|---|---|
| JP | 06-083011 B2 | 10/1994 |
| JP | 2003-046366 A | 2/2003 |

(Continued)

*Primary Examiner* — J. San Martin

(57) ABSTRACT

An AT-cut crystal resonator plate (2) includes a first main surface (2a) on which a first excitation electrode (211) is formed and a second main surface (2b) on which a second excitation electrode (212) is formed. The AT-cut crystal resonator plate (2) further includes: a substantially rectangular-shaped vibrating part (21) that is piezoelectrically vibrated when a voltage is applied to the first excitation electrode (211) and the second excitation electrode (212); a holding part (22) protruding from a corner part (21a) of the vibrating part (21) in a Z' axis direction of the AT-cut crystal; and an external frame part (23) configured to surround an external circumference of the vibrating part (21) and to hold the holding part (22).

16 Claims, 17 Drawing Sheets

(56) References Cited

U.S. PATENT DOCUMENTS

| | | | | |
|---|---|---|---|---|
| 2007/0252480 A1* | 11/2007 | Tsuchido | ............ | H03H 9/0595 |
| | | | | 310/340 |
| 2008/0079334 A1* | 4/2008 | Yong | ................. | H03H 9/02023 |
| | | | | 310/361 |
| 2009/0066191 A1* | 3/2009 | Tsuchido | ............ | H03H 9/0595 |
| | | | | 310/353 |
| 2011/0234052 A1* | 9/2011 | Amano | ................... | H03H 3/02 |
| | | | | 310/344 |
| 2012/0098390 A1* | 4/2012 | Takahashi | ............ | H03H 9/1035 |
| | | | | 310/348 |
| 2012/0169182 A1 | 7/2012 | Mizusawa et al. | | |
| 2013/0043771 A1* | 2/2013 | Sasaki | ..................... | H03H 9/19 |
| | | | | 310/344 |
| 2017/0099040 A1* | 4/2017 | Obata | ...................... | H03H 9/19 |
| 2017/0366162 A1* | 12/2017 | Noto | ....................... | H01L 23/02 |

FOREIGN PATENT DOCUMENTS

| | | |
|---|---|---|
| JP | 2007-214942 A | 8/2007 |
| JP | 2009-105509 A | 5/2009 |
| JP | 2011-091173 A | 5/2011 |
| JP | 2012-074807 A | 4/2012 |
| JP | 2012-156978 A | 8/2012 |

* cited by examiner (a)

(b)

(c)

(a)

(b)

CRYSTAL RESONATOR PLATE AND CRYSTAL RESONATOR DEVICE

TECHNICAL FIELD

The present invention relates to an AT-cut crystal resonator plate having a first main surface on which a first excitation electrode is formed and a second main surface on which a second excitation electrode is formed, and to a crystal resonator device in which the crystal resonator plate is mounted.

BACKGROUND ART

Patent Document 1 discloses a piezoelectric resonator including: a piezoelectric resonator plate provided with excitation electrodes; a support frame disposed so as to surround the piezoelectric resonator plate; and coupling parts that couple the piezoelectric resonator plate to the support frame. In this piezoelectric resonator, the coupling parts are constituted by a first coupling part and a second coupling part each connecting a corresponding corner of the vibrating part respectively to different corners of the support frame in the −X direction. An end of the piezoelectric resonator plate in the −X direction is supported by the support frame in a cantilevered manner.

Patent Documents 2 and 3 are known as inventions related to an AT-cut crystal resonator whose main vibration mode is a thickness shear vibration. The At-cut crystal resonator is suitable for downsizing and increasing the frequency and has excellent frequency temperature characteristics.

When the crystal axes of a synthetic crystal are respectively referred to as an X axis, a Y axis and a Z axis, an AT-cut crystal resonator is obtained by rotating the synthetic crystal about the X axis by 35° 15'. Note that, in the present description, the Y axis after rotated by 35° 15' is referred to as a Y' axis, and the Z axis after rotated by 35° 15' is referred to as a Z' axis.

Patent Document 2 discloses a crystal resonator 100 including: a vibrating part 300 that is provided with excitation electrodes 200; a frame part 500 surrounding the vibrating part 300; and connecting parts 400 that connect the frame part 500 to the vibrating part 300. In this crystal resonator 100, the connecting parts 400 are connected to the frame part 500 at three positions (each corner parts and a central part) on one end side (i.e. at six positions on both end sides) of the vibrating part 300 in the X axis direction of the crystal axes (see FIG. 15).

Also, Patent Document 3 discloses a piezoelectric resonator plate including: a vibrating part having main surfaces on which excitation electrodes are respectively formed; a frame part arranged on an outer circumferential side of the vibrating part via a through groove; and support parts connecting the vibrating part to the frame part. Sawtooth notches are formed on a front side and a rear side of each respective support part along its width direction.

PRIOR ART DOCUMENTS

Patent Documents

[Patent Document 1] JP 2011-091173 A
[Patent Document 2] JP 1106-083011 B
[Patent Document 3] JP 2007-214942 A

SUMMARY OF THE INVENTION

Problem to be Solved by the Invention

Problems related to the inventions according to Patent Documents 1 to 3 will be described with reference to FIGS. 15 and 16. FIG. 15 is a plan view of a conventional crystal resonator plate. FIG. 16(*a*) is an explanatory diagram explaining a vibration deflection of the crystal resonator plate. FIG. 16(*b*) is a graph indicating a charge distribution of the crystal resonator plate in the X axis direction. FIG. 16(*c*) is a graph indicating a charge distribution of the crystal resonator plate in the Z' axis direction. In the graphs shown in FIGS. 16(*b*) and 16(*c*), the horizontal axis represents the position in the crystal resonator plate, and the vertical axis represents a charge quantity at each position.

As it can be seen from FIG. 16(*a*), which explains the vibration deflection of the crystal resonator plate, it is generally known that the thickness shear vibration occurs when a voltage is applied to the crystal resonator plate, and that the X axis direction is dominant as the vibration direction of the crystal resonator plate, which results in the displacement of the piezoelectric vibration in the X axis direction larger than that in the Z' axis direction.

For this reason, if the piezoelectric resonator plate is held in the X axis direction in which the piezoelectric vibration is large as described in Patent document 1 (i.e. an end of the piezoelectric resonator plate in the −X direction is supported in a cantilevered manner), a vibration leakage of the piezoelectric resonator plate is likely to occur via the first coupling part and the second coupling part, which may reduce the piezoelectric vibration efficiency. That is, in order to hold the piezoelectric resonator plate by the coupling part, it is not preferable to dispose the coupling part along the X axis direction in which the piezoelectric vibration is dominant.

According to the graph of FIG. 16(*b*) that indicates the charge distribution of the crystal resonator plate in the X axis direction, it can be seen that the charge distribution is large at the central position of the crystal resonator plate. In contrast, according to FIG. 16(*c*) that indicates the charge distribution of the crystal resonator plate in the Z' direction, the charge distribution is substantially uniform, although it has a tendency to slightly decrease toward both ends of the crystal resonator plate. From this, when the voltage is applied to the crystal resonator plate in order to cause the piezoelectric vibration, it can be seen that, in the X axis direction, the displacement of the piezoelectric vibration is large at the central part where the charge distribution is large. On the other hand, the charge distribution is substantially uniform in the Z' direction, thus it can be seen that the displacement of the piezoelectric vibration is uniform.

In brief, it can be seen, from the graphs of FIGS. 16(*b*) and 16(*c*), that if the crystal resonator plate that is being piezoelectrically vibrated is held at the central part thereof in the X axis direction in which the displacement of the piezoelectric vibration is large, the piezoelectric vibration is prevented, thus the piezoelectric vibration efficiency degrades.

In view of the above, when the vibrating part 300 is connected at the central position thereof in the X axis direction to the frame part 500, for example in the AT-cut crystal resonator as shown in Patent Document 2, the vibration leakage is likely to occur compared to the corner part because the displacement of the piezoelectric vibration at the central position is large. Thus, the piezoelectric vibration of the vibrating part 300 is prevented, which degrades the piezoelectric vibration efficiency.

The present invention was made in consideration of the above circumstances, an object of which is to provide an AT-cut crystal resonator plate having a high piezoelectric vibration efficiency to cause the piezoelectric vibration efficiently, and to provide a crystal resonator device including the crystal resonator plate.

Means for Solving the Problem

In order to achieve the above object, the present invention includes a configuration described below.

A crystal resonator plate according to the present invention is an AT-cut crystal resonator plate including a first main surface on which a first excitation electrode is formed and a second main surface on which a second excitation electrode formed. The AT-cut crystal resonator plate further includes: a substantially rectangular-shaped vibrating part having the first excitation electrode and the second excitation electrode; a holding part protruding from a corner part of the vibrating part in a Z' axis direction of the AT-cut crystal; and an external frame part configured to surround an external circumference of the vibrating part and to hold the holding part.

In the crystal resonator plate having the above-described configuration of the present invention, the holding part is protruded from the corner part of the vibrating part in the Z' axis direction of the AT-cut crystal so as to be held by the external frame part. Thus, unlike the conventional crystal resonator plate, the vibrating part is not held at the central position on the side along the X axis direction. Therefore, when the crystal resonator plate is piezoelectrically vibrated, it is possible to cause an efficient piezoelectric vibration.

The crystal resonator plate as described above may have a configuration in which the first excitation electrode and the second excitation electrode are each formed at a position spaced apart from a region on an extended line of the holding part in the Z' axis direction toward a central direction of the vibrating part.

With the above-described configuration, the first excitation electrode and the second excitation electrode are not formed on the extended line of the holding part in the Z' axis direction. As a result, the piezoelectric vibration of the crystal resonator plate can be prevented from leaking along the holding part to the external frame part, thus, it is possible to confine the piezoelectric vibration of the crystal resonator plate in the vibrating part.

In the crystal resonator plate as described above, the holding parts may be respectively protruded toward the external frame part from two corner parts disposed in the vibrating part in the Z' axis direction.

In this case, the vibrating part of the crystal resonator plate is held by the external frame part via the holding parts respectively extended from the two corner parts of the vibrating part in the Z' axis direction. Thus, the vibrating part can be reliably held. Furthermore, the respective wiring patterns of the first excitation electrode and the second excitation electrode that are formed respectively on both main surfaces of the crystal resonator plate can be independently disposed via the respective holding parts protruded from the two corner parts. Thus, it is possible to suppress the parasitic capacitance between the wiring patterns, which prevents reduction in the frequency variation amount.

In the above-described crystal resonator plate, the holding part may be protruded toward the external frame part from one corner part disposed in the vibrating part.

In this case, the vibrating part of the crystal resonator plate is held by the external frame part via the holding part that is protruded from one corner part toward the external frame part. Since the number of the holding parts is reduced, it is possible to further suppress the vibration leakage to the external frame part. Also, compared to the configuration having two holding parts, it is possible to reduce the stress application rate, which results in reduction in the frequency shift due to the stress. Thus, the piezoelectric vibration of the crystal resonator plate can be stably caused.

The above-described crystal resonator plate may have a configuration in which the external frame part has a thickness larger than a thickness of the holding part.

With the above-described configuration, because of the difference in the thickness between the external frame part and the holding part, the natural frequency of the piezoelectric vibration is also different between the external frame part and the holding part. Thus, when the vibrating part is piezoelectrically vibrated, the external frame part hardly resonates with the piezoelectric vibration of the holding part.

The above-described crystal resonator plate may have a configuration in which a mesa structure is formed at a position of the vibrating part, the position on which the first excitation electrode and the second excitation electrode are formed, so that a central region of the vibrating part is thicker than a region surrounding the central region.

In this case, the mesa structure is formed at the position of the vibrating part, on which the first excitation electrode and the second excitation electrode are formed. Thus, the parts to be piezoelectrically vibrated have different thicknesses, which results in difference in the frequency of the piezoelectric vibration. Since a boundary between different frequencies can be formed, it is possible to improve an effect of confining the piezoelectric vibration. By confining thus the piezoelectric vibration, the piezoelectric vibration can be prevented from leaking.

The above-described crystal resonator plate may have a configuration in which a groove is disposed in at least one of the vibrating part and the holding part, and the groove is inclined toward a central part of the vibrating part relative to an X axis direction of the AT-cut crystal.

In this case, when the crystal resonator plate is piezoelectrically vibrated, the groove formed in the vibrating part prevents the piezoelectric vibration from leaking outside the vibrating part. Thus, it is possible to confine the piezoelectric vibration in the vibrating part.

The above-described crystal resonator plate may have a configuration in which the groove is constituted by: one or more first grooves formed in the first main surface of the vibrating part; and one or more second grooves formed in the second main surface of the vibrating part, and also may have a configuration in which the one or more first grooves and the one or more second grooves are alternately arranged in the holding part, from a side of the vibrating part to a side of the external frame part.

In this case, since the first groove(s) and the second groove(s) are alternately arranged in the holding part, from the side of the vibrating part to the side of the external frame part. Thus, it is possible to improve an effect of confining the piezoelectric vibration.

A crystal resonator device according to the present invention includes: the above-described crystal resonator plate; a first sealing member covering the first main surface of the crystal resonator plate; and a second sealing member covering the second main surface of the crystal resonator plate.

With the above-described configuration in which the crystal resonator plate is interposed between the first sealing member and the second sealing member, it is possible to manufacture a relatively downsized crystal resonator device. Also, since the crystal resonator plate has the features as described above, it is possible to prevent the vibration leakage and to obtain, accordingly, a crystal resonator device having a high piezoelectric vibration efficiency to cause efficiently the piezoelectric vibration.

In the above-described crystal resonator plate, the external frame part may include a recessed part that is disposed at a position to be connected to the holding part in at least one of the first main surface and the second main surface. The respective thicknesses of the external frame part, the recessed part and the holding part may have a relation represented by the following expression: (thickness of the external frame part)>(thickness of the recessed part)≥(thickness of the holding part).

In this case, when an impact or the like acts on the crystal resonator device, the recessed part serves to avoid or relax the stress concentration at the connecting part of the external frame part and the holding part, which leads to improvement in shock resistance of the crystal resonator device. Furthermore, the recessed part serves to suppress the vibration leakage from the vibrating part to the external frame part. That is, when the vibration leaks from the vibrating part, it may pass through the holding part to reach the external frame part. However, because the recessed part is disposed in the position where the vibration leaks from the holding part to the external frame part, it is possible to adjust the vibration leakage to prevent resonance with the external frame part, thus the vibration is not likely to be transmitted to the external frame part.

In the above-described crystal resonator plate, the recessed part may be formed in each of the first main surface and the second main surface.

In this case, it is possible to further improve the shock resistance of the crystal resonator device due to the recessed parts that are formed in both main surfaces.

In the above-described crystal resonator plate, the bottom surface of the recessed part may be formed so as to be the same surface as the surface of the holding part.

In this case, since there is no step between the bottom surface of the recessed part and the surface of the holding part, it is possible to avoid the stress concentration at the connecting part between the external frame part and the holding part, which leads to improvement in shock resistance of the crystal resonator device.

In the above-described crystal resonator plate, a bottom surface of the recessed part may be formed so that there is a step between the bottom surface of the recessed part and the surface of the holding part.

In this case, the step remains at the connecting part of the external frame part and the holding part. However, the external frame part itself also has a step at the boundary between the region where the recessed part is formed and the other region. In this way, when an impact or the like acts on the crystal resonator device, the stress is distributed to the above two step parts. As a result, it is possible to relax the stress concentration at the connecting part of the external frame part and the holding part, which leads to improvement in shock resistance of the crystal resonator device.

In the above-described crystal resonator plate, when a width direction is set to a direction orthogonal to the protruding direction of the holding part from the external frame part, viewing from a direction perpendicular to the main surface of the external frame part, a width of the recessed part may be larger than a width of the holding part.

In this case, since the width of the recessed part is larger than the width of the holding part, it is possible to improve an effect of the stress distribution by the recessed part or to improve an effect of vibration damping.

In the above-described crystal resonator plate, an interior wall surface of the recessed part may have a curvature when viewed from a direction perpendicular to the main surface of the external frame part.

In this case, the interior wall surface of the recessed part can have a shape with no vertex. Thus, it is possible to avoid the stress concentration on the vertex.

Effect of the Invention

The present invention can provide an AT-cut crystal resonator plate having a high piezoelectric vibration efficiency to cause efficiently the piezoelectric vibration, and a crystal resonator device including the above AT-cut crystal resonator plate.

BRIEF DESCRIPTION OF THE DRAWINGS

FIG. 18(a) is a perspective view showing a connecting structure of a holding part and an external frame part when the external frame part is provided with no recessed part. FIG. 18(b) is a perspective view showing a connecting structure of the holding part and the external frame part when the connecting structure is formed so that a bottom surface of a recessed part is the same surface as a surface of the holding part. FIG. 18(c) is a perspective view showing a connecting structure of the holding part and the external frame part when the connecting structure is formed so as to have a step between the bottom surface of the recessed part and the surface of the holding part.

FIG. 19(a) is a plan view showing a variation of the shape of the recessed part.

FIG. 19(b) is a plan view showing another variation of the shape of the recessed part.

MODES FOR CARRYING OUT THE INVENTION

Hereinafter, three embodiments of the crystal resonator device according to the present invention will be described. The description of the embodiments will be given on the subject matters in the order of: the configuration of the crystal resonator device; the method for manufacturing the crystal resonator device; and functions and effects of the crystal resonator device.

Configuration of Crystal Resonator Device According to First Embodiment

Figure 1:
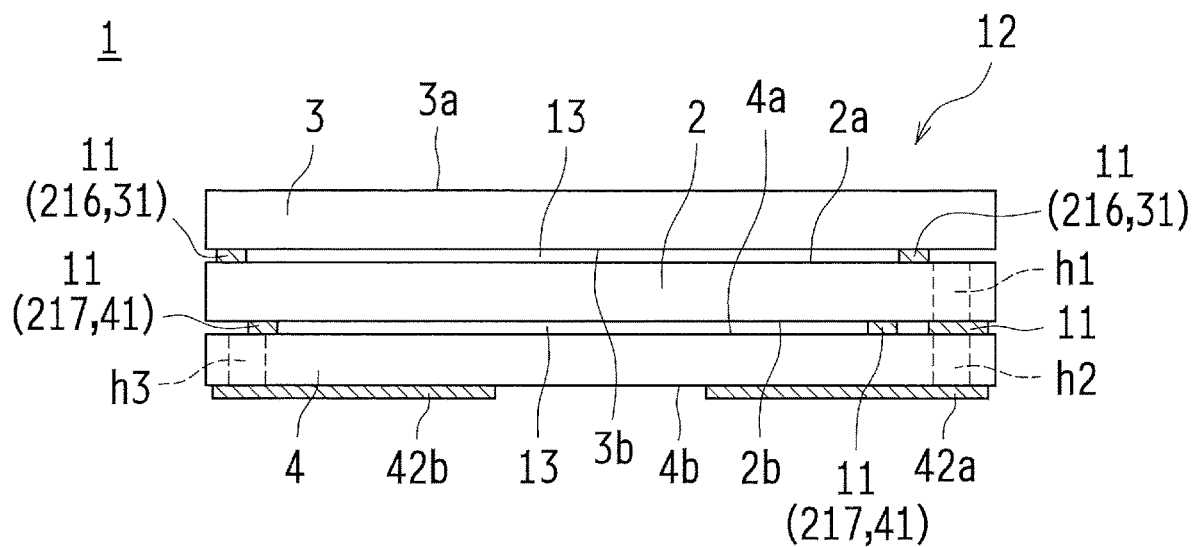
FIG. 1 is a schematic configuration diagram showing respective components of an embodiment of a crystal resonator according to the present invention.

The configuration of a crystal resonator device 1 according to the present invention is described with reference to FIG. 1. FIG. 1 is a schematic configuration diagram showing respective components of an embodiment of the crystal resonator.

In the drawings, parts corresponding to electrodes are shown by hatching. Also, in cross-sectional views described later, only the parts corresponding to the electrodes are shown by hatching, and the other parts are not hatched to enhance the visibility of the drawings.

The crystal resonator device 1 according to the present invention is, for example, a crystal resonator including: a crystal resonator plate 2; a first sealing member 3 that covers and hermetically seals a first main surface 2a of the crystal resonator plate 2; and a second sealing member 4 that covers and hermetically seals a second main surface 2b of the crystal resonator plate 2. In the crystal resonator device 1, the crystal resonator plate 2 is bonded to the first sealing member 3, and also is bonded to the second sealing member 4.

That is, the crystal resonator device 1 is made as a package 12 having a sandwich structure in which an internal space 13 is hermetically sealed, more specifically, the internal space 13 between the first sealing member 3 and the crystal resonator plate 2, and the internal space 13 between the crystal resonator plate 2 and the second sealing member 4 (see FIG. 1).

The crystal resonator device 1 has a package size of 1.0×0.8 mm, which is reduced in size and height. According to the size reduction, no castellation is formed in the package 12. As described later, through holes (a first through hole h1, a second through hole h2, and a third through hole h3) are used for conduction between electrodes.

As shown in FIG. 1, the internal space 13 is located so as to be deflected to one end side (left side) of the package 12 in plan view.

Hereinafter, each components will be described.
First Sealing Member

Figure 2:
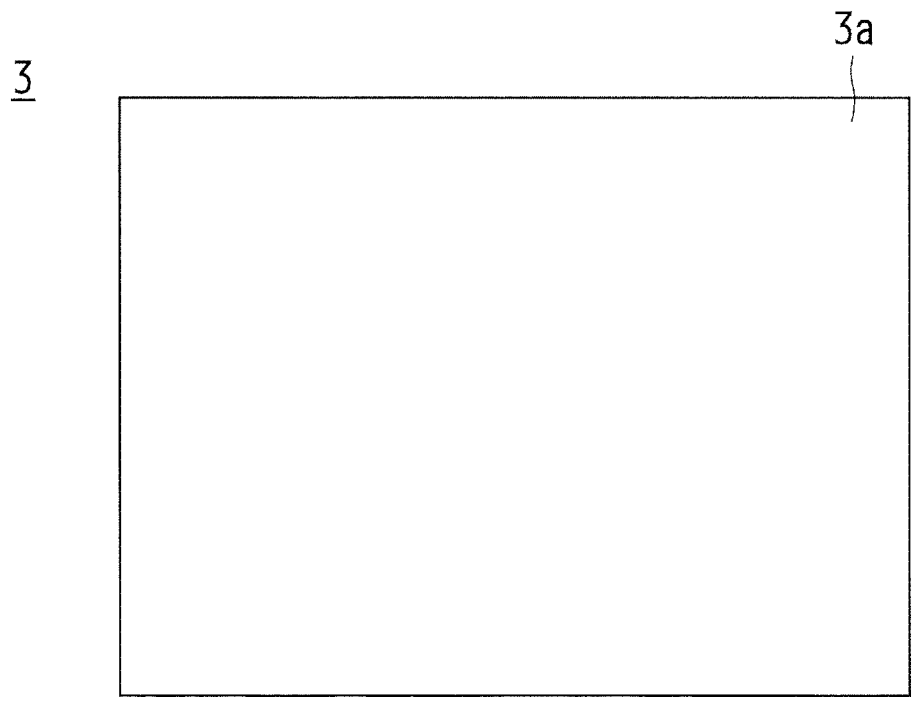
FIG. 2 is a schematic plan view of a first sealing member of the crystal resonator according to the embodiment of the present invention.
Figure 3:
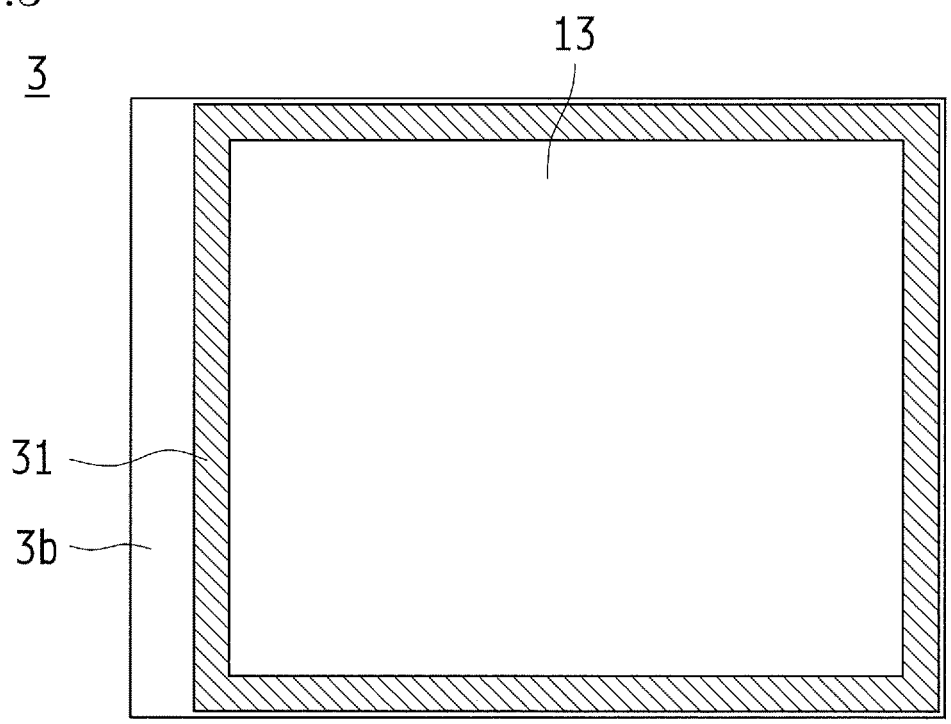
FIG. 3 is a schematic bottom view the first sealing member of the crystal resonator according to the embodiment of the present invention.

The first sealing member 3 of the crystal resonator device 1 according to the present invention is described with reference to FIGS. 2 and 3. FIG. 2 is a schematic plan view of the first sealing member. FIG. 3 is a schematic bottom view of the first sealing member.

The first sealing member 3 is made of a material having the flexural rigidity (moment of inertia of area×Young's modulus) of not more than 1000 [N·mm²]. Specifically, as shown in FIGS. 2 and 3, the first sealing member 3 is a substrate having a rectangular parallelepiped shape that is made of a single glass wafer or a single crystal wafer. The first main surface 3a is an upper surface. The second main surface 3b (the surface to be bonded to the crystal resonator plate 2) is formed as a smooth flat surface (mirror finished).

On the second main surface 3b of the first sealing member 3, a sealing-member-side first bonding pattern 31 to be bonded to the crystal resonator plate 2 is disposed so as to enclose the internal space 13. As shown in FIG. 3, the sealing-member-side first bonding pattern 31 is located so as to be deflected to the left side in plan view of the second main surface 3b of the first sealing member 3. The sealing-member-side first bonding pattern 31 has a constant line width at all positions.

The sealing-member-side first bonding pattern 31 is constituted by a base PVD film deposited on the first sealing member 3 by the physical vapor deposition, and an electrode PVD film deposited on the base PVD film by the physical vapor deposition. In this embodiment, the base PVD film is made of Ti (or Cr), and the electrode PVD film is made of Au. Also, the sealing-member-side first bonding pattern 31 does not contain Sn.

Crystal Resonator Plate

Figure 4A:
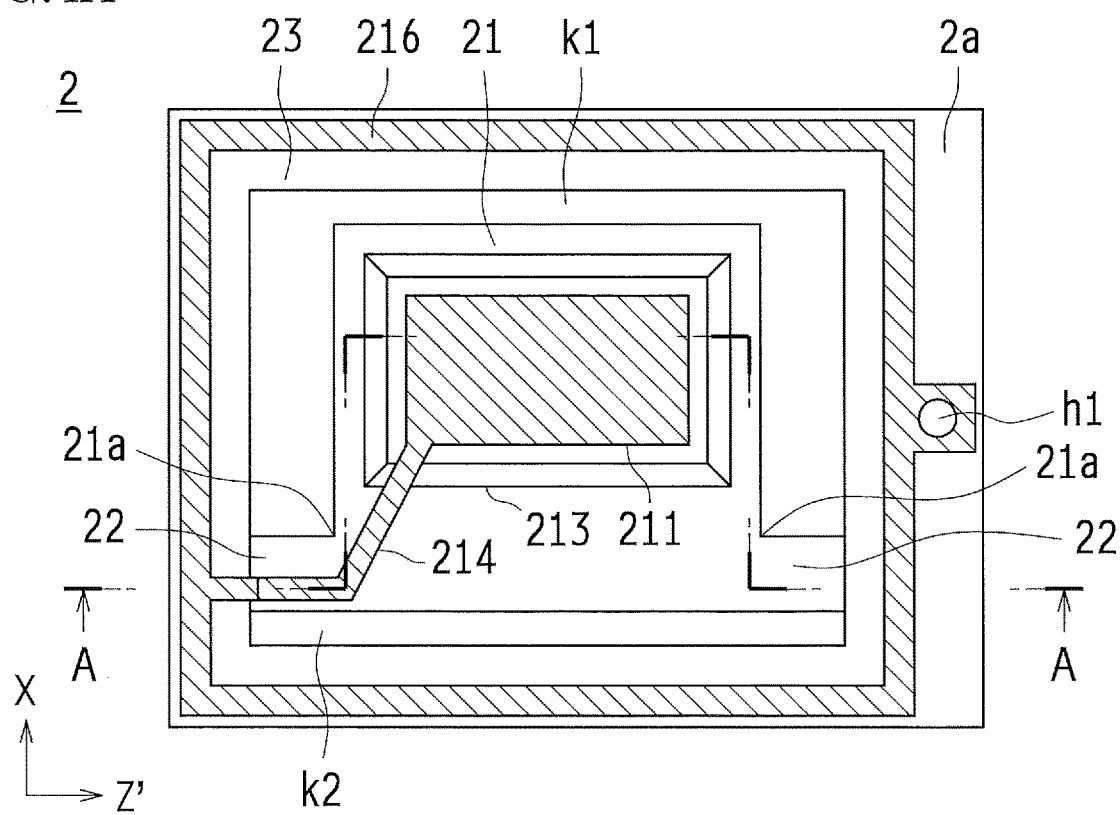
FIG. 4A is a schematic plan view of the crystal resonator plate of a first embodiment according to the present invention.
Figure 4B:
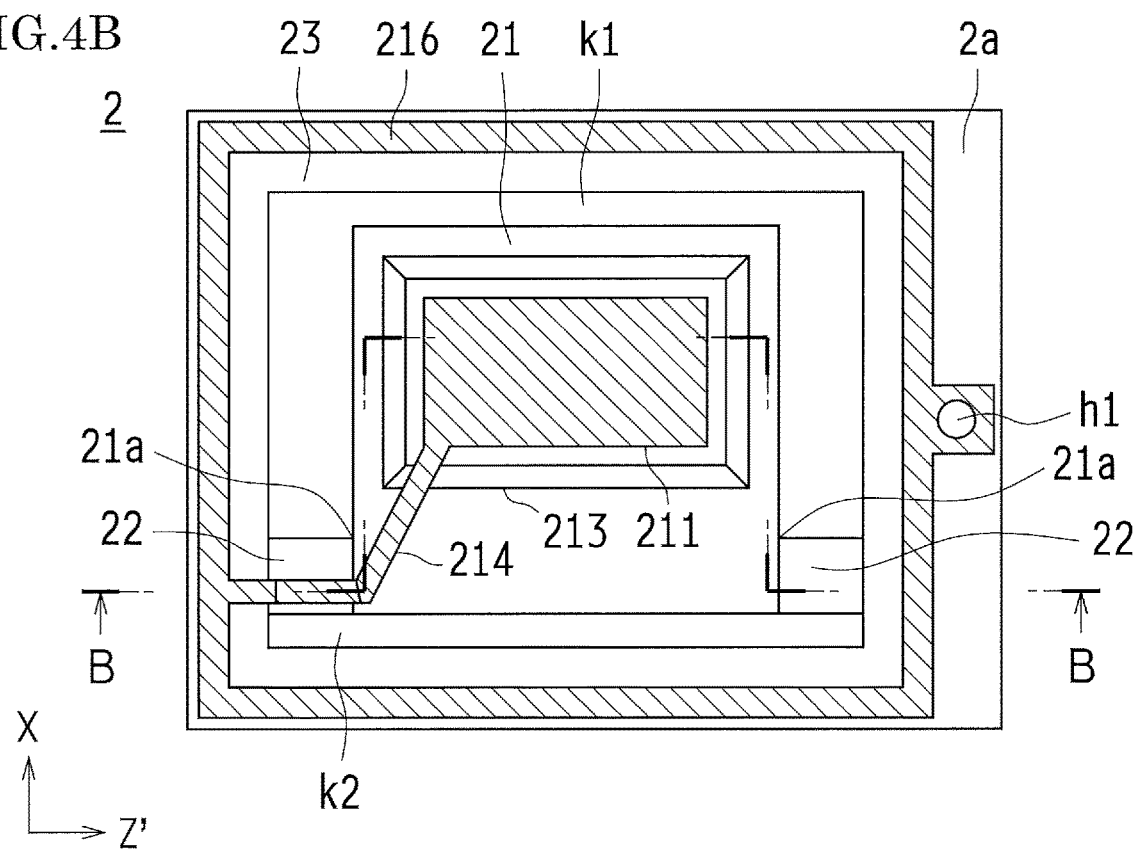
FIG. 4B is a schematic plan view of another example of the crystal resonator plate in the first embodiment according to the present invention.
Figure 5:
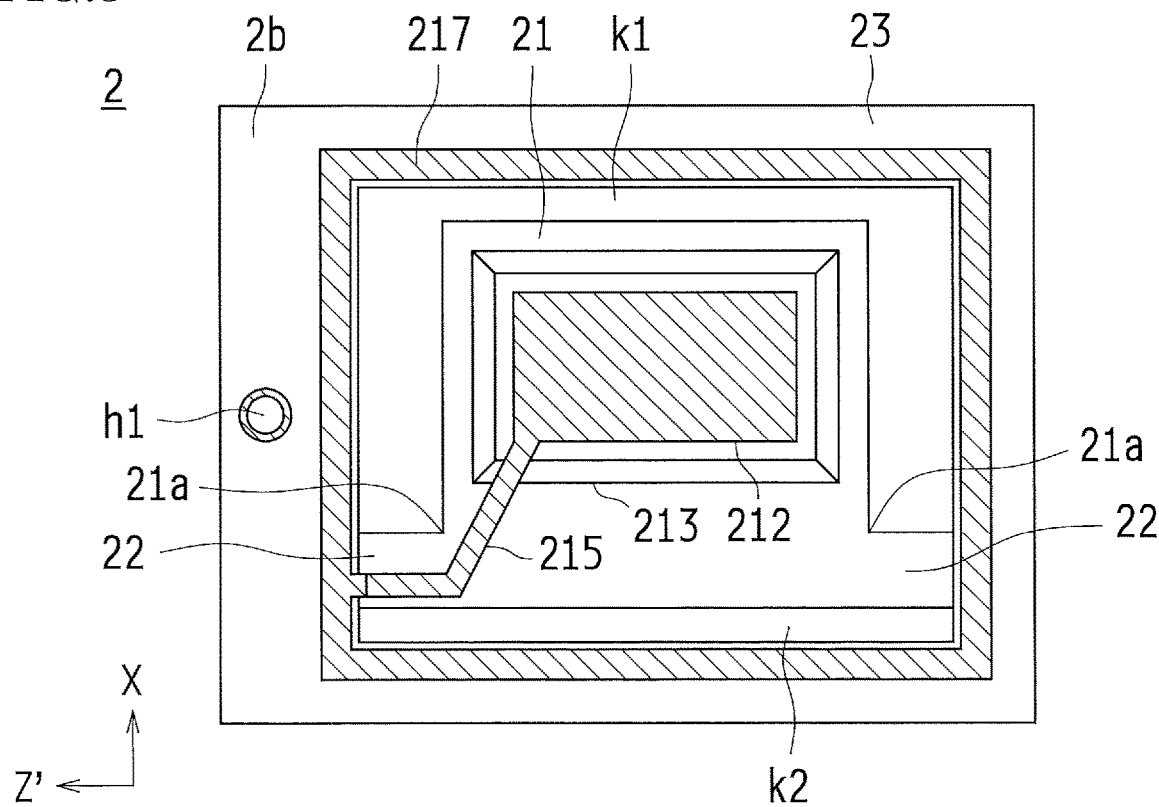
FIG. 5 is a schematic bottom view of the crystal resonator plate of the first embodiment according to the present invention.
Figure 6A:
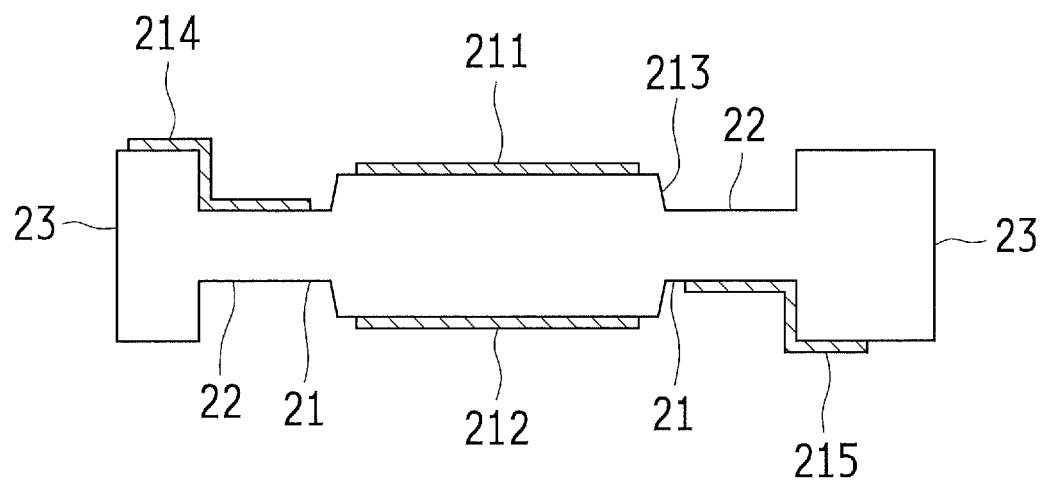
FIG. 6A is a cross-sectional view taken from line A-A of FIG. 4A.
Figure 6B:
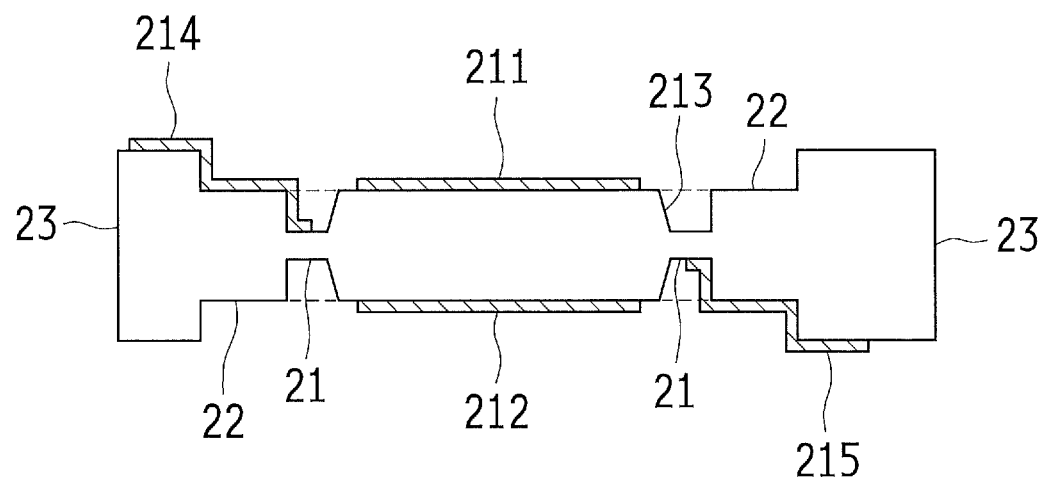
FIG. 6B is a cross-sectional view taken from line B-B of FIG. 4B.
Figure 6C:
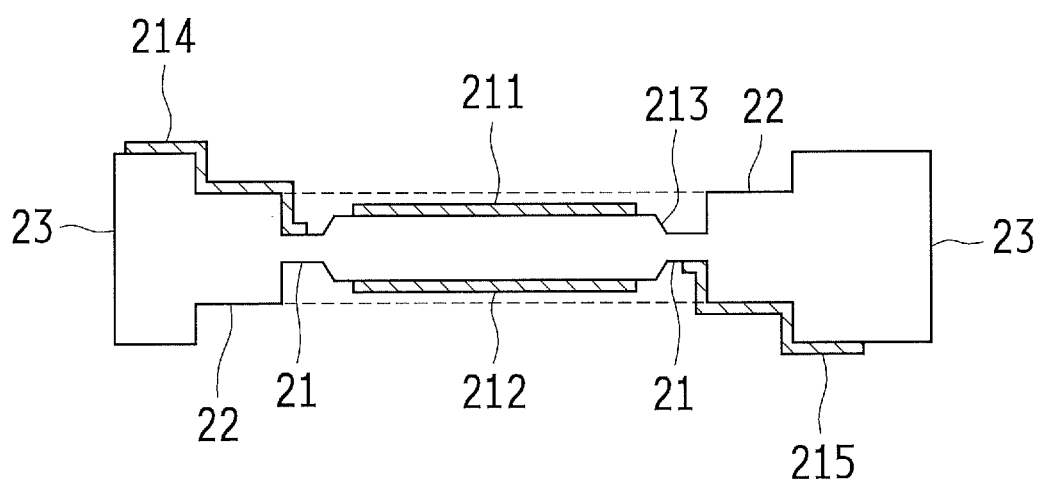
FIG. 6C is a cross-sectional view of another example of the crystal resonator plate according to the present invention.

An embodiment of the crystal resonator plate 2 according to the present invention is described with reference to FIGS. 4 to 6. FIG. 4A is a schematic plan view of the crystal resonator plate of the first embodiment. FIG. 4B is a schematic plan view of another example of the crystal resonator plate in the first embodiment. FIG. 5 is a schematic bottom view of the crystal resonator plate of the first embodiment. FIG. 6A is a cross-sectional view taken from line A-A of FIG. 4A. FIG. 6B is a cross-sectional view taken from line B-B of FIG. 4B. FIG. 6C is a cross-sectional view of another example of the crystal resonator plate.

The crystal resonator plate 2 according to this embodiment is an AT-cut crystal processed by rotating a rectangular-shaped crystal plate about the X axis among the crystal axes by 35° 15'. The crystal resonator plate 2 includes: a vibrating part 21; holding parts 22; and an external frame part 23 (see FIGS. 4A and 5). In the present description, the crystal axes of a synthetic crystal are referred to as the X axis, the Y axis and the Z axis, and the Y axis and the Z axis when rotating the AT-cut crystal about the X axis by 35° 15' are respectively referred to as a Y' axis and a Z' axis.

The crystal resonator plate 2 in the examples shown in the drawings has cut-out parts formed by cutting out the rectangular-shaped crystal plate. The cut-out parts are constituted by an inversed U-shaped part k1 in plan view and an oblong rectangular part k2 in plan view. The crystal resonator plate 2 is made of a crystal that is a piezoelectric material, and both main surfaces thereof (i.e., the first main surface 2a and the second main surface 2b) are each formed as a smooth flat surface (mirror finished).

The vibrating part 21 has a substantially rectangular shape and is piezoelectrically vibrated upon voltage application. The vibrating part 21 is not required to have square corner parts. The corner parts may be chamfered when the vibrating part 21 is formed by wet etching. A first excitation electrode 211 and a second excitation electrode 212 are respectively formed on the first main surface 2a and the second main surface 2b of the vibrating part 21 so as to apply a voltage to the vibrating part 21. At the position of the vibrating part 21 on which the first excitation electrode 211 and the second excitation electrode 212 are formed, a mesa structure 213 may be formed so that the central region of the vibrating part 21 is thicker than the region surrounding the central region (see FIG. 6A). In this case, since the central part of the crystal resonator plate 2 has a larger thickness as the mesa structure 213, it is possible to improve an effect of confining the piezoelectric vibration.

The first excitation electrode 211 and the second excitation electrode 212 are formed at a position spaced apart from the region on the extended line of the holding parts 22 (described later) in the Z' axis direction toward the central direction of the vibrating part 21. Thus, the first excitation electrode 211 and the second excitation electrode 212 are not formed on the extended line of the holding parts 22 in the Z' axis direction. Accordingly, it is possible to keep a relatively long distance between the region where the crystal resonator plate 2 is piezoelectrically vibrated and the holding parts 22. As a result, the piezoelectric vibration of the crystal resonator plate 2 can be prevented from leaking along the holding parts 22 to the external frame part 23, thus, it is possible to confine the piezoelectric vibration of the crystal resonator plate 2 in the vibrating part 21.

The first excitation electrode 211 and the second excitation electrode 212 are each constituted by a base PVD film (Ti or Cr) deposited on the vibrating part 21 by the physical vapor deposition, and an electrode PVD film (Au) deposited on the base PVD film by the physical vapor deposition.

The first excitation electrode 211 and the second excitation electrode 212 are extracted outside the vibrating part 21 via the holding parts 22 and 22 on which are respectively formed a first extraction electrode 214 and a second extraction electrode 215 that extract the respective excitation electrodes. In the examples shown in the drawings, on the first main surface 2a, the first extraction electrode 214 is extracted from the corner part of the first excitation electrode 211. On the second main surface 2b, the second extraction electrode 215 is extracted from the corner part of the second excitation electrode 212 so that its extracted direction is opposite to the direction in which the first extraction electrode 214 is extracted on the first main surface 2a (see FIG. 6A).

The holding parts 22 and 22 are protruded from the respective corner parts of the rectangular shaped vibrating part 21 in the Z' direction of the AT-cut crystal. In this embodiment, the holding parts 22 and 22 are protruded respectively from the two corner parts 21a disposed in the vibrating part 21 in the Z' direction toward the external frame part 23 (see FIGS. 4A and 5). In the examples shown in the drawings, the first excitation electrode 211 is extracted via the holding part 22 on the left side in plan view (in the −Z' axis direction), and the second excitation electrode 212 is extracted via the holding part 22 on the right side in bottom view (in the +Z' axis direction).

The external frame part 23 surrounds the external circumference of the vibrating part 21 and holds the holding parts 22. On the first main surface 2a, a resonator-plate-side first bonding pattern 216 is formed so as to be bonded to the first sealing member 3. On the second main surface 2b, a resonator-plate-side second bonding pattern 217 is formed so as to be bonded to the second sealing member 4. As shown in FIG. 1, the resonator-plate-side first bonding pattern 216 and the resonator-plate-side second bonding pattern 217 are located so as to be deflected to the left side in plan view of both main surfaces 2a and 2b.

The resonator-plate-side first bonding pattern 216 and the resonator-plate-side second bonding pattern 217 are each constituted by a base PVD film (Ti or Cr) deposited on the external frame part 23 by the physical vapor deposition, and an electrode PVD film (Au) deposited on the base PVD film by the physical vapor deposition. The resonator-plate-side first bonding pattern 216 and the resonator-plate-side second bonding pattern 217 do not contain Sn. That is, the same materials as the materials for the first excitation electrode 211 and the second excitation electrode 212 are used. Also, the resonator-plate-side first bonding pattern 216 and the resonator-plate-side second bonding pattern 217 may be made of electrode materials different from those for the first excitation electrode 211 and the second excitation electrode 212.

The first through hole h1 is formed in the external frame part 23. The first through hole h1 is to extract, to the side of the second main surface 2b, the resonator-plate-side first bonding pattern 216 that is connected to the first excitation electrode 211. The first through hole h1 is disposed in the outward position of the internal space 13, and located so as to be deflected to the other end side (right side) in plan view of both main surfaces 2a and 2b, as shown in FIG. 1. Thus, the first through hole h1 is not formed in the inward position of the internal space 13. Here, the inward position of the internal space 13 means strictly the inner side of the inner peripheral surface of the bonding material 11, not including the position on the bonding material 11 (resonator-plate-side first bonding pattern 216).

It is preferable that the thickness of the external frame part 23 is larger than the thickness of the holding parts 22 (see FIG. 6A). In this case, because of the difference in the thickness between the external frame part 23 and the holding parts 22, the natural frequency of the piezoelectric vibration is also different between the external frame part 23 and the holding parts 22. Thus, the external frame part 23 hardly resonates with the piezoelectric vibration of the holding parts 22. Also, it is possible to enlarge each space between the piezoelectric resonator plate 2 and the first sealing member 3, and between the piezoelectric resonator plate 2 and the second sealing member 4. Thus, the vibrating part 21 of the piezoelectric resonator plate 2 can be prevented from making contact with the first sealing member 3 or the second sealing member 4.

Generally, the piezoelectric vibration is not likely to transmit from the thick part to the thin part, accordingly, an effect of blocking the piezoelectric vibration is provided.

In view of the above, as another example of the crystal resonator plate 2 of this embodiment, the thickness of the holding part 22 may be larger than the thickness of the vibrating part 21, as shown in FIGS. 4B and 6B. In this case, each boundary between the holding parts 22 and the vibrating part 21 is formed at a position where the thickness of the holding part 22 differs from the thickness of the vibrating part 21. Thus, it is possible to not consider the unnecessary vibration including the vibration of the holding parts 22 when considering the piezoelectric vibration of the vibrating part 21.

Also, as another example of the crystal resonator plate 2 of this embodiment, the thickness of the holding part 22 may be lamer than the thickness of the mesa structure 213 of the vibrating part 21, as shown in FIG. 6C. In this case, since the thickness of the holding part 22 is lamer than the thickness of the mesa structure 213, the holding part 22 is not likely to resonate with the vibrating part 21. Thus, it is possible to efficiently prevent the vibration energy of the vibrating part 21 from transmitting to the holding part and being lost.

Second Sealing Member

Figure 7:
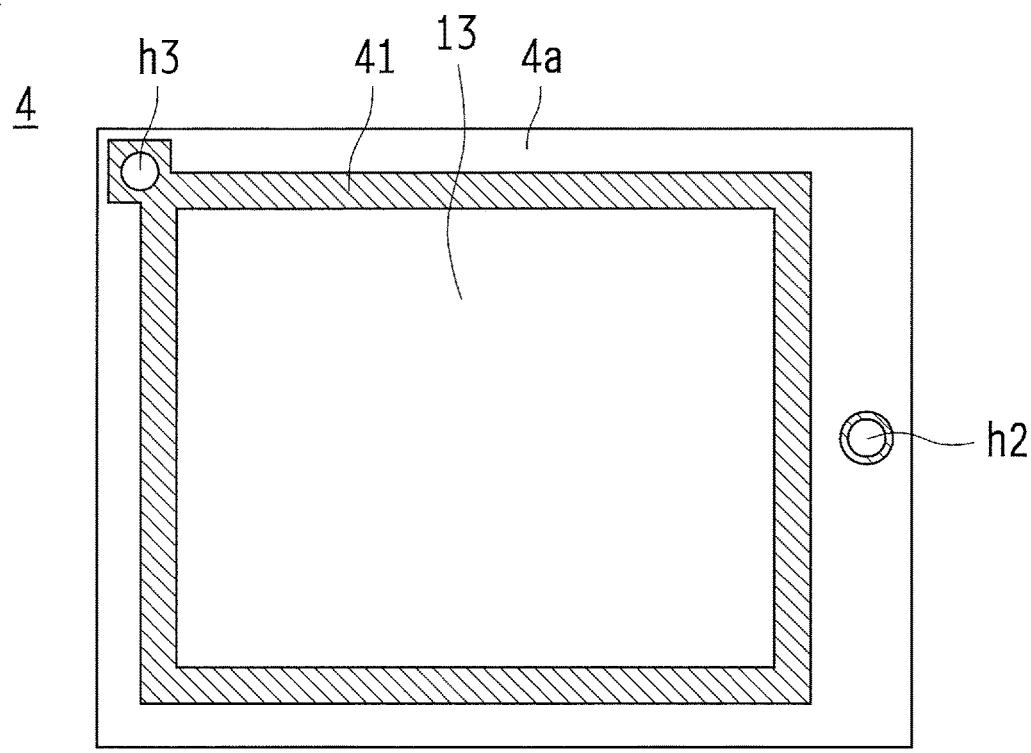
FIG. 7 is a schematic plan view of a second sealing member of the crystal resonator according to the embodiment of the present invention.
Figure 8:
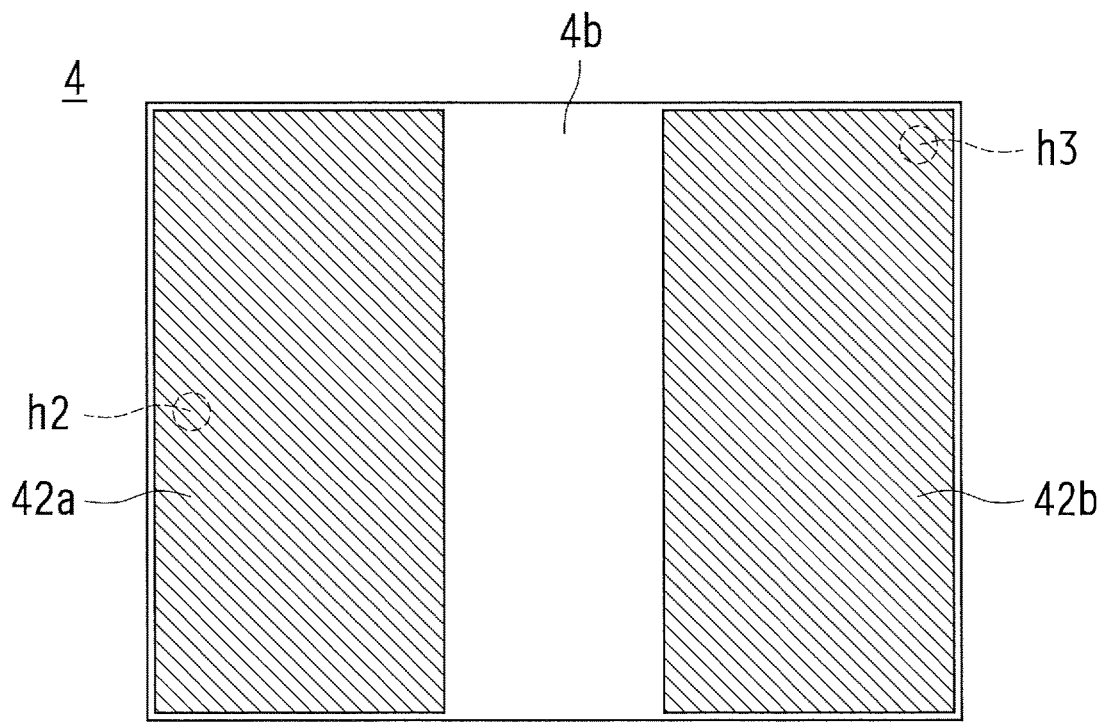
FIG. 8 is a schematic bottom view of the second sealing member of the crystal resonator according to the embodiment of the present invention.

The second sealing member of the crystal resonator device according to the present invention is described with reference to FIGS. 7 and 8. FIG. 7 is a schematic plan view of the second sealing member of the crystal resonator. FIG. 8 is a schematic bottom view of the second sealing member of the crystal resonator.

The second sealing member 4 is made of a material having the flexural rigidity (moment of inertia of area× Young's modulus) of not more than 1000 [N·mm²]. Specifically, as shown in FIG. 7, the second sealing member 4 is a substrate having a rectangular parallelepiped shape that is made of a single glass wafer or a single crystal wafer. A first main surface 4a (the surface to be bonded to the crystal resonator plate 2) of the second sealing member 4 is formed as a smooth flat surface (mirror finished).

On the first main surface 4a of the second sealing member 4, a sealing-member-side second bonding pattern 41 to be bonded to the crystal resonator plate 2 is disposed so as to enclose the internal space 13. As shown in FIGS. 1 and 7, the sealing-member-side second bonding pattern 41 is located so as to be deflected to the left side in plan view of the first main surface 4a of the second sealing member 4. The sealing-member-side second bonding pattern 41 has a constant line width at all positions.

The sealing-member-side second bonding pattern 41 is constituted by a base PVD film deposited on the second sealing member 4 by the physical vapor deposition, and an electrode PVD film deposited on the base PVD film by the physical vapor deposition.

In this embodiment, the base PVD film is made of Ti (or Cr), and the electrode PVD film is made of Au. Also, the sealing-member-side second bonding pattern 41 does not contain Sn.

On the second main surface 4b of the second sealing member 4, a pair of external electrode terminals (a first external electrode terminal 42a and a second external electrode terminal 42b) to be electrically connected to the outside is disposed (see FIG. 8). Note that the number of the external electrode terminals is not limited to two. Three or more external electrode terminals may be disposed.

The first external electrode terminal 42a is electrically connected, directly, to the first excitation electrode 211 via the resonator-plate-side first bonding pattern 216. The second external electrode terminal 42b is electrically connected, directly, to the second excitation electrode 222 via the resonator-plate-side second bonding pattern 217.

As shown in FIG. 8, the first external electrode terminal 42a and the second external electrode terminal 42b are respectively located on both ends in the longitudinal direction in plan view of the second main surface 4b of the second sealing member 4. The pair of external electrode terminals (the first external electrode terminal 42a and the second external electrode terminal 42b) is each constituted by a base PVD film deposited on the second main surface 4b by the physical vapor deposition, and an electrode PVD film deposited on the base PVD film by the physical vapor deposition.

Compared to each base PVD film of the above-described resonator-plate-side first bonding pattern 216, the resonator-plate-side second bonding pattern 217, the sealing-member-side first bonding pattern 31 and the sealing-member-side second bonding pattern 41, each base PVD film of the external electrode terminals (the first external electrode terminal 42a and the second external electrode terminal 42b) has a large thickness. Also, the first external electrode terminal 42a and the second external electrode terminal 42b each cover a region of not less than ⅓ of the area of the second main surface 4b of the second sealing member 4.

In the second sealing member 4, as shown in FIGS. 1, 7 and 8, two through holes (the second through hole h2 and the third through hole h3) are formed. The second through hole h2 and the third through hole h3 are disposed in the outward position of the internal space 13. As shown in FIG. 7, the second through hole h2 is located on the right side in plan view of both main surfaces (the first main surface 4a and the second main surface 4b) and the third through hole h3 is located on the upper left side in plan view. That is, the second through hole h2 and the third through hole h3 are not formed in the inward position of the internal space 13.

Here, the inward position of the internal space 13 means strictly the inner side of the inner peripheral surface of the bonding material 11, not including the position on the bonding material 11 (the sealing-member-side second bonding pattern 41).

Method for Manufacturing Crystal Resonator Device of First Embodiment

Here, description is given on a method for manufacturing the crystal resonator device 1 using the above-described components, i.e. the crystal resonator plate 2, the first sealing member 3 and the second sealing member 4.

The first sealing member 3 is bonded to the crystal resonator plate 2 in a state in which the resonator-plate-side first bonding pattern 216 of the crystal resonator plate 2 and the sealing-member-side first bonding pattern 31 of the first sealing member 3 are overlapped with each other.

Similarly to the above, the second sealing member 4 is bonded to the crystal resonator plate 2 in a state in which the resonator-plate-side second bonding pattern 217 of the crystal resonator plate 2 and the sealing-member-side second bonding pattern 41 of the second sealing member 4 are overlapped with each other.

Thus, the first sealing member 3 is bonded to the crystal resonator plate 2, and the second sealing member 4 is bonded to the crystal resonator plate 2, by being subjected to diffusion bonding in a state in which each bonding pattern is overlapped with the corresponding bonding pattern. Using the diffusion bonding as the bonding method can prevent generation of gas that occurs in case of bonding using an adhesive and the like, however, it is possible to use a publicly known special bonding material such as an adhesive.

In the package 12 manufactured as described above, the first sealing member 3 and the crystal resonator plate 2 have a gap of not more than 1.00 μm. The second sealing member 4 and the crystal resonator plate 2 have a gap of not more than 1.00 μm. That is, the thickness of the bonding material 11 between the first sealing member 3 and the crystal resonator plate 2 is not more than 1.00 μm, and the thickness of the bonding material 11 between the second sealing member 4 and the crystal resonator plate 2 is not more than 1.00 μm (specifically, the thickness in the Au—Au bonding of this embodiment is 0.15 to 1.00 μm). As a comparative example, the conventional metal paste sealing material containing Sn has a thickness of 5 to 20 μm.

Functions and Effects of Crystal Resonator Device of First Embodiment

As described above, in the crystal resonator plate 2 according to this embodiment, the respective holding parts 22 are protruded from the respective corner parts 21*a* of the vibrating part 21 in the Z' direction of the AT-cut crystal so as to be held by the external frame part 23. Thus, unlike the conventional crystal resonator plate, the vibrating part 21 is not held at the central position of the vibrating part 21 in the X axis direction, i.e. the position where the displacement of the piezoelectric vibration is large. Therefore, when the crystal resonator plate 2 is piezoelectrically vibrated, it is possible to efficiently cause the piezoelectric vibration.

Also, the vibrating part 21 of the crystal resonator plate 2 is held by the external frame part 23 via the holding parts 22 respectively extended from the two corner parts 21*a* in the Z' axis direction. Thus, the vibrating part 21 can be reliably held. Furthermore, the respective wiring patterns of the first excitation electrode 211 and the second excitation electrode 212 that are formed respectively on both main surfaces of the crystal resonator plate 2 can be independently disposed via the respective holding parts 22 protruded from the two corner parts 21*a*. Thus, it is possible to suppress the parasitic capacitance between the wiring patterns, which prevents reduction in the frequency variation amount.

Configuration of Variation of Crystal Resonator Device of First Embodiment

Next, the respective configurations of the four variations of the crystal resonator device in the first embodiment are described with reference to FIGS. 9 to 13. Since these variations merely differ from the above embodiment in formation of a groove m in the above-described crystal resonator plate 2, only such a difference is described hereinafter. The same components are referred to as the same reference numerals and the description thereof is omitted.

Also, any configuration obtained by combining Variation 1 to Variation 4 may be provided.

Crystal Resonator Plate

The crystal resonator plate 2 according to these variations includes a groove m that is disposed in at least one of the vibrating part 21 and the holding part 22. The groove m is inclined toward the central part of the vibrating part 21 (i.e. the central part C of the first excitation electrode 211 and the second excitation electrode 212 in plan view) relative to the X axis direction of the AT-cut crystal (see FIGS. 9 to 13).

<First Variation>

Figure 9:
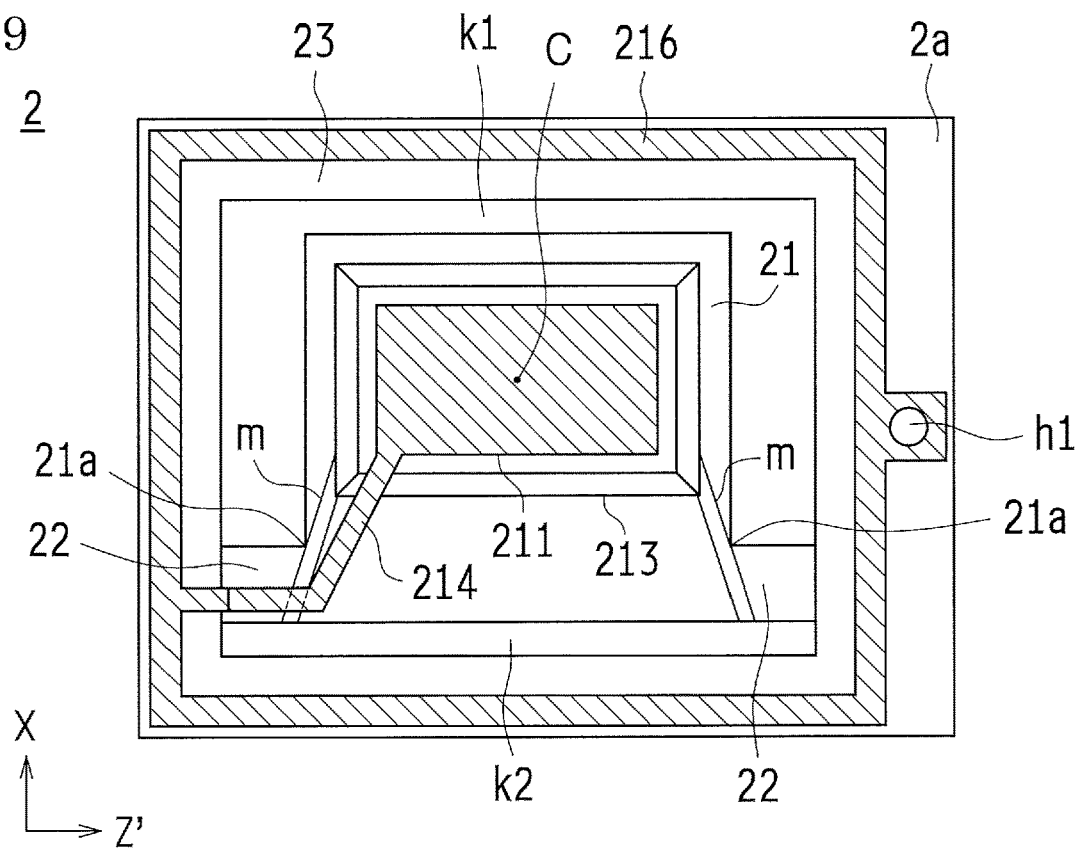
FIG. 9 is a schematic plan view of a first variation of the crystal resonator plate in the first embodiment according to the present invention.

In the variation shown in FIG. 9, the groove m is formed from the corner part of the bottom of the mesa structure 213 toward the holding part 22. In this variation, the groove m is provided so as to make contact with the corner part 21*a*, thus it is possible to efficiently suppress the leakage of the piezoelectric vibration. However, the groove m may be formed so as to not make contact with the corner part 21*a*. Also, the groove m may be formed so as to extend from the vibrating part 21 to the holding part 22.

<Second Variation>

Figure 10:
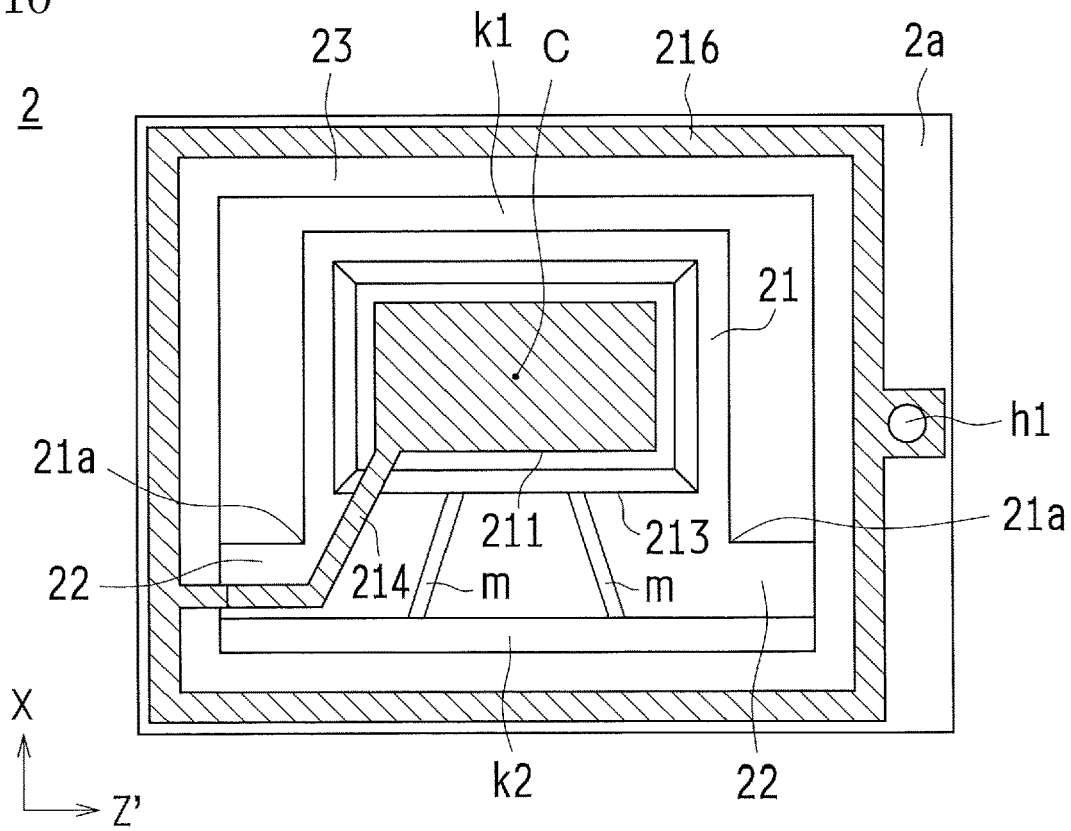
FIG. 10 is a schematic plan view of a second variation of the crystal resonator plate in the first embodiment according to the present invention.

In the variation shown in FIG. 10, the groove m is formed from a side of the mesa structure 213 along the Z' axis toward the edge of the external circumference of the vibrating part 21.

With the variations shown in FIGS. 9 and 10, it is possible to effectively suppress the leakage of the piezoelectric vibration that transmits in the Z' axis direction.

<Third Variation>

Figure 11:
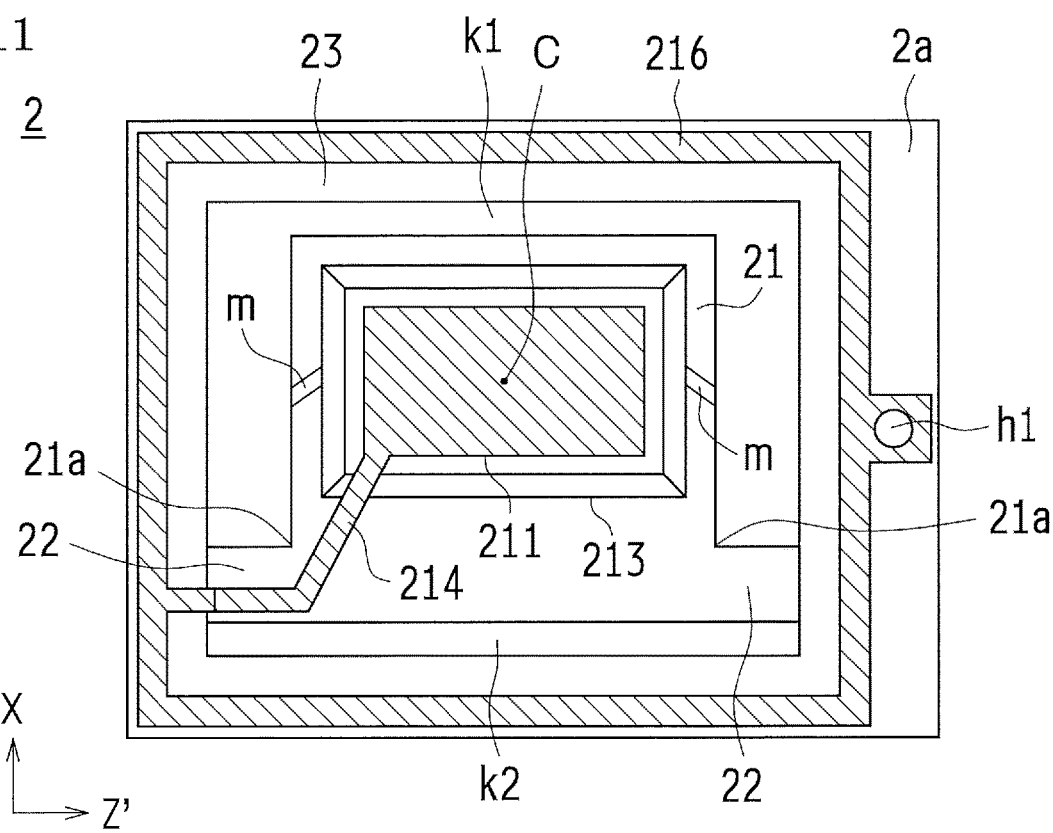
FIG. 11 is a schematic plan view of a third variation of the crystal resonator plate in the first embodiment according to the present invention.

In the variation shown in FIG. 11, the groove m is formed from a side of the mesa structure 213 along the X axis toward the edge of the external circumference of the vibrating part 21.

With the variation shown in FIG. 11, it is possible to effectively suppress the leakage of the piezoelectric vibration that transmits in the X axis direction.

<Fourth Variation>

Figure 12:
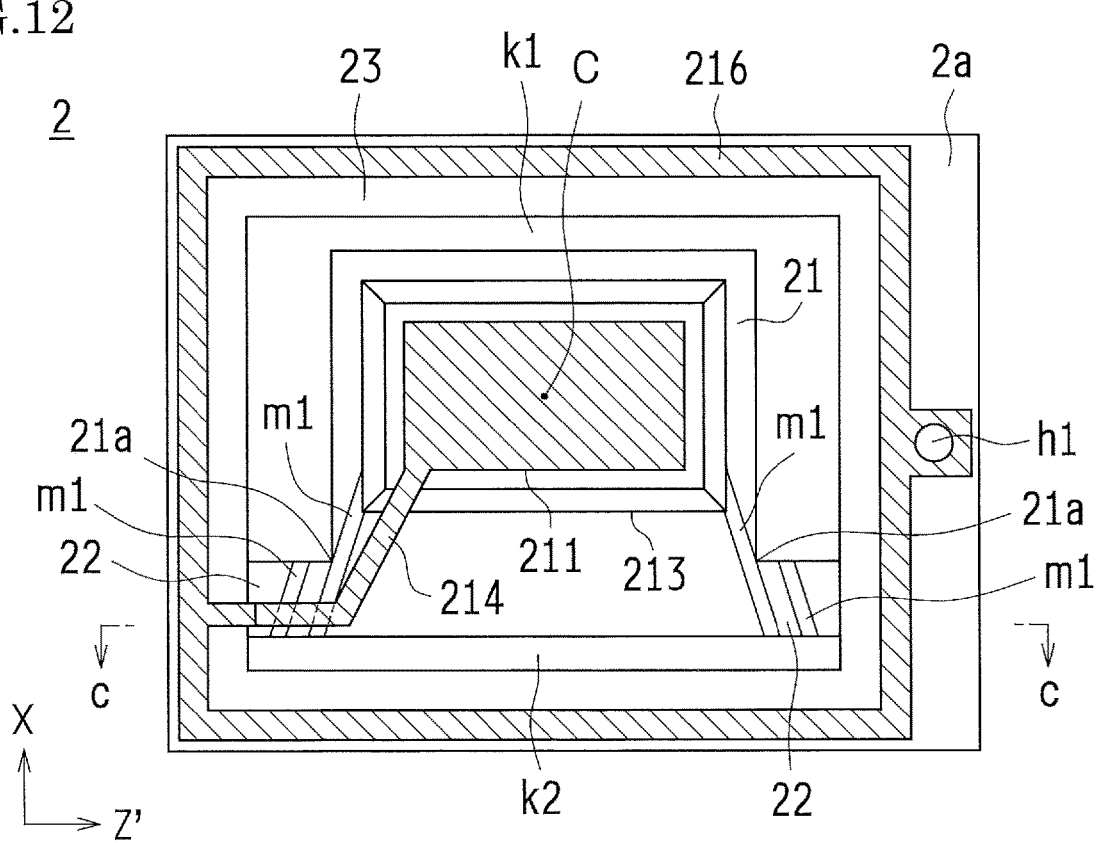
FIG. 12 is a schematic plan view of a fourth variation of the crystal resonator plate in the first embodiment according to the present invention.
Figure 13:
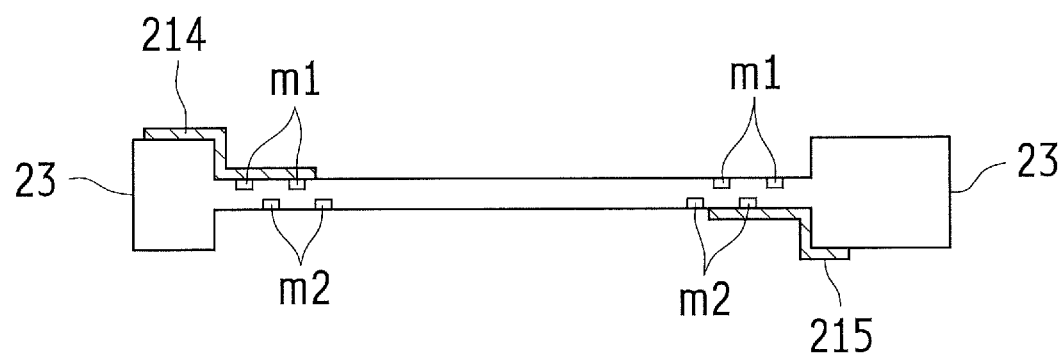
FIG. 13 is a cross-sectional view taken from line c-c of FIG. 12.

In the variation shown in FIGS. 12 and 13, the grooves m are constituted by one or more first grooves m1 formed in the first main surface of the vibrating part 21 and one or more second grooves m2 formed in the second main surface of the vibrating part 21. The first groove(s) m1 and the second groove(s) m2 are alternately arranged in the holding part 22, from the side of the vibrating part 21 to the side of the external frame part 23.

In the examples shown in the drawings, two first grooves m1 are formed. One of them is formed in the vibrating part 21 and the other is formed in the holding part 22. Likewise, two second grooves m2 (see FIG. 13) are formed. One of them is formed in the vibrating part 21 and the other is formed in the holding part 22.

With the variation shown in FIG. 12, the first grooves m1 and the second grooves m2 are formed so as to extend from the side of the vibrating part 21 of the holding part 22 to the side of the external frame part 23 so that the first groove m1 and the second groove m2 are alternately arranged (see FIG. 13). Thus, it is possible to improve the effect of confining the piezoelectric vibration.

In this Variation, the first groove m1 is provided so as to make contact with the corner part 21a, thus it is possible to efficiently suppress the leakage of the piezoelectric vibration. However, the first groove m1 may be formed so as to not make contact with the corner part 21a.

Configuration of Crystal Resonator Device of Second Embodiment

Figure 14:
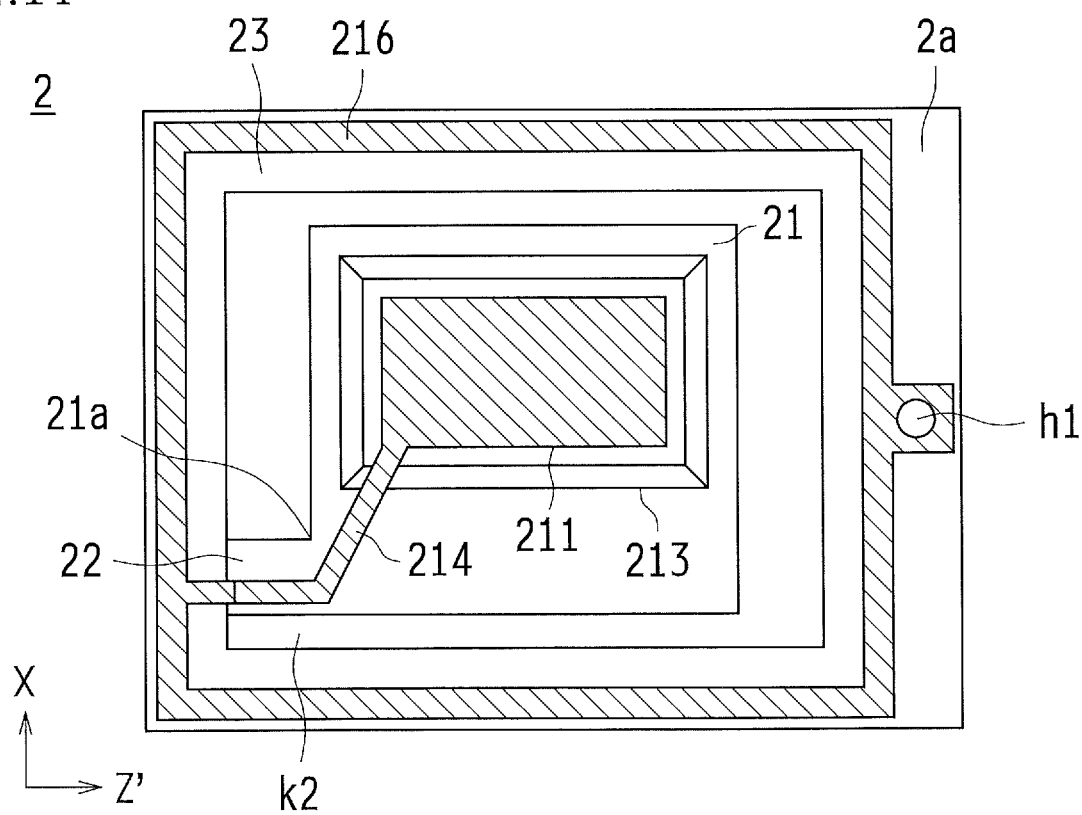
FIG. 14 is a schematic plan view of the crystal resonator plate of a second embodiment according to the present invention.
Figure 15:
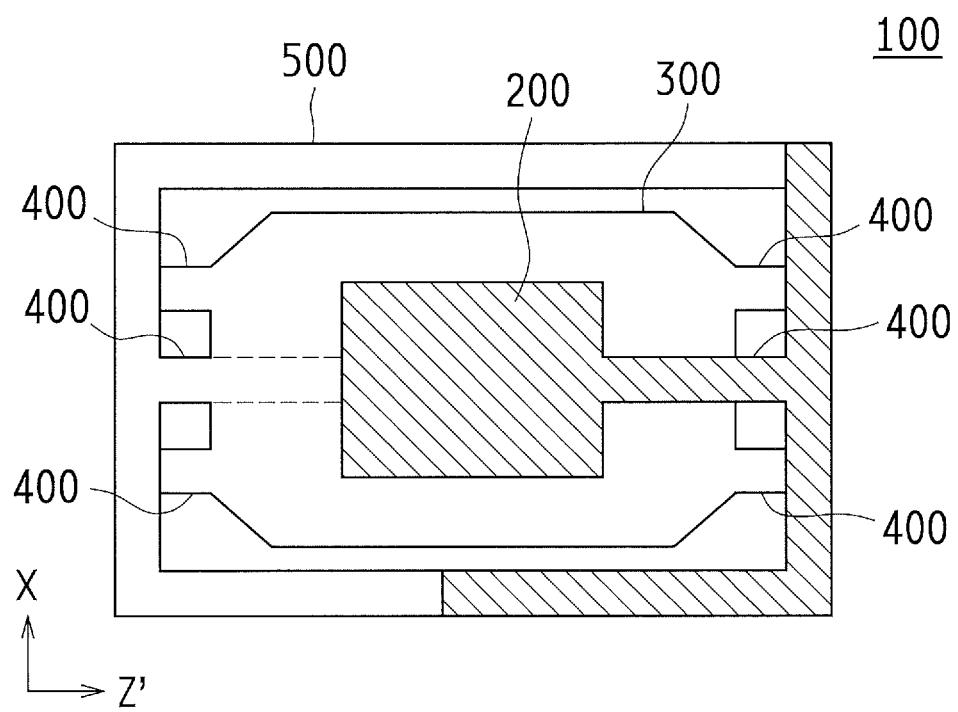
FIG. 15 is a plan view of a conventional crystal resonator plate.
Figure 16:
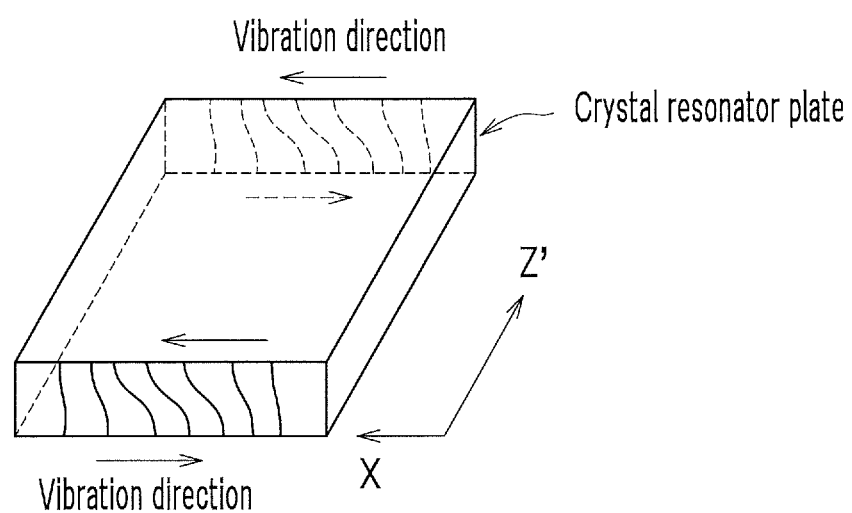
FIG. 16(a) is an explanatory diagram explaining a vibration deflection of the crystal resonator plate.
FIG. 16(b) is a graph indicating a charge distribution of the crystal resonator plate in an X axis direction among the crystal axes.
FIG. 16(c) is a graph indicating a charge distribution of the crystal resonator plate in a Z' axis direction among the crystal axes.
Figure 16:
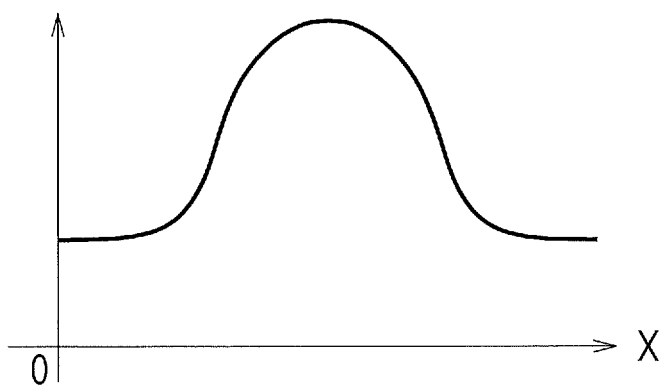
Figure 16:
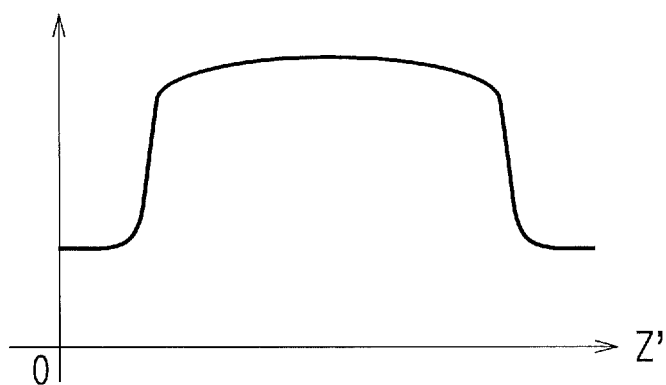

Next, the configuration of the crystal resonator device in the second embodiment is described with reference to FIG. 14. Since the second embodiment merely differs in the location and number of the holding parts 22 of the crystal resonator plate 2, only such differences are described hereinafter. The same components are referred to as the same reference numerals and the description thereof is omitted.

Crystal Resonator Plate

In this embodiment, the holding part 22 of the crystal resonator plate 2 is protruded from one corner part 21a disposed in the vibrating part 21 toward the external frame part 23.

In this case, the vibrating part 21 of the crystal resonator plate is held by the external frame part 23 via the holding part 22 that is protruded from one corner part 21a toward the external frame part 23. Since the number of the holding parts 22 is reduced, it is possible to efficiently hold the vibrating part 21.

Configuration of Crystal Resonator Device of Third Embodiment

Next, the configuration of the crystal resonator device in the third embodiment is described with reference to FIGS. 17 and 18. Since the third embodiment merely differs in the connecting structure of the holding part 22 and the external frame part 23 of the crystal resonator plate 2, only such a difference is described hereinafter. The same components are referred to as the same reference numerals and the description thereof is omitted.

Figure 17:
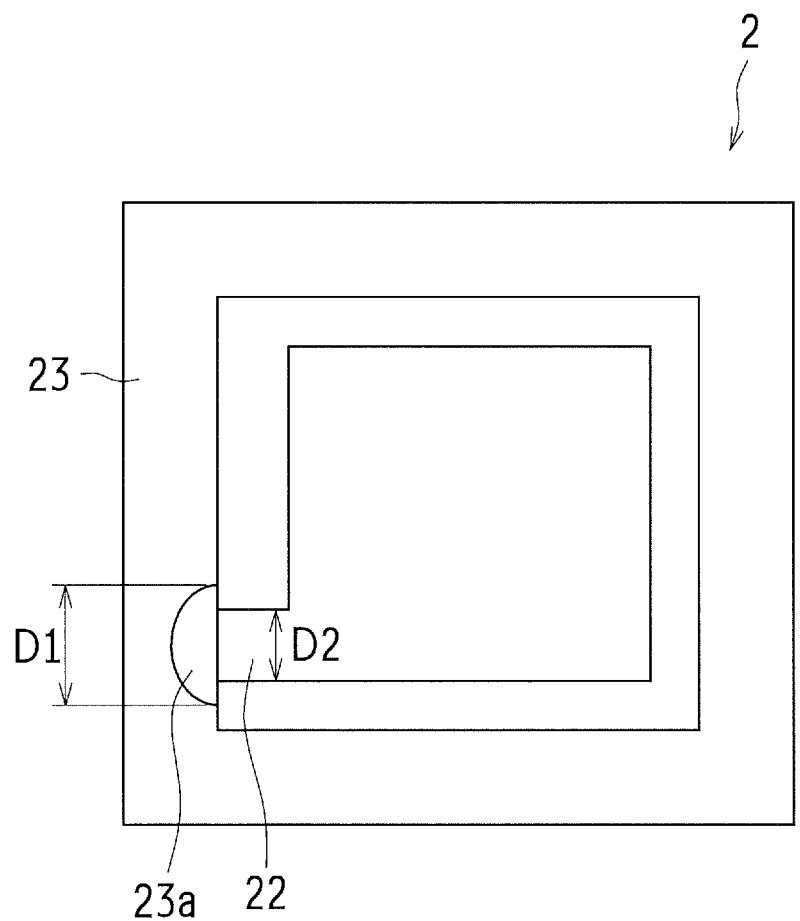
FIG. 17 is a schematic plan view of the crystal resonator plate of a third embodiment according to the present invention.

In the crystal resonator device according to this embodiment as shown in FIG. 17, the external frame part 23 of the crystal resonator plate 2 is provided with a recessed part 23a around the boundary with the holding part 22, the recessed part 23a being thinner than the external frame part 23. FIG. 18(a) is a perspective view showing the connecting structure of the holding part 22 and the external frame part 23 when the external frame part 23 is provided with no recessed part 23a. FIGS. 18(b) and 18(c) are perspective views each showing the connecting structure of the holding part 22 and the external frame part 23 when the external frame part 23 is provided with the recessed part 23a.

As shown in FIG. 18(b), the bottom surface of the recessed part 23a may be formed so that it is the same surface as the surface of the holding part 22 (i.e. so that there is no step between the recessed part 23a and the holding part 22). Alternatively, as shown in FIG. 18(c), the bottom surface of the recessed part 23a may be formed so that there is a step between the bottom surface of the recessed part 23a and the surface of the holding part 22. The bottom surface of the recessed part 23a and the surface of the holding part 22 are in parallel with the first main surface 2a and the second main surface 2b of the crystal resonator plate 2.

FIGS. 18(b) and 18(c) exemplarily show the configurations in which the recessed parts 23a are respectively formed in both main surfaces of the crystal resonator plate 2. However, the recessed part 23a may be formed in at least one of the main surfaces of the crystal resonator plate 2. In this way, the respective thicknesses of the external frame part 23, the recessed part 23a and the holding part 22 have the relation represented by the following expression: (thickness of external frame part 23)>(thickness of recessed part 23a)≥(thickness of holding part 22).

Figure 18:
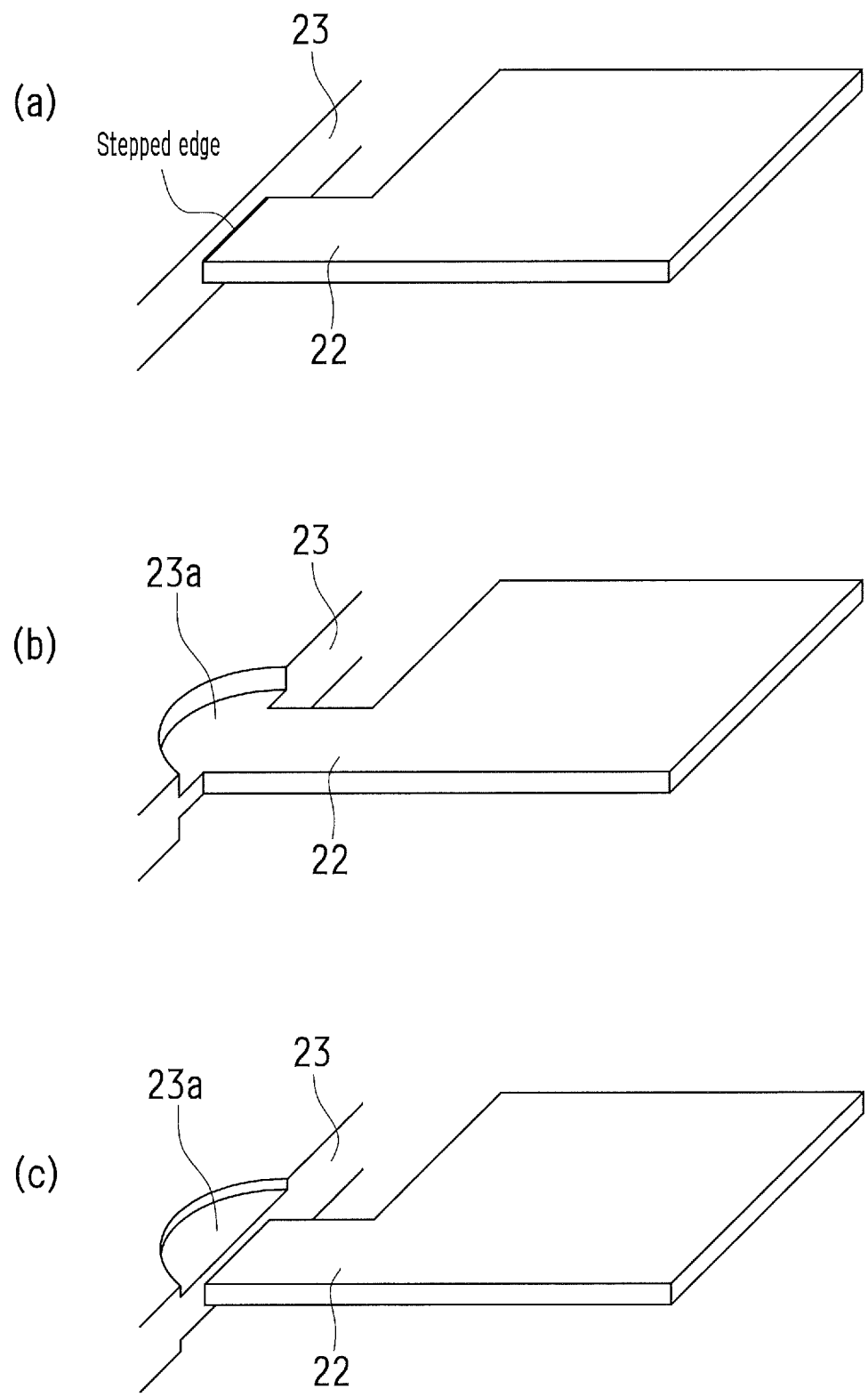
[FIGS. 18]
Figure 19:
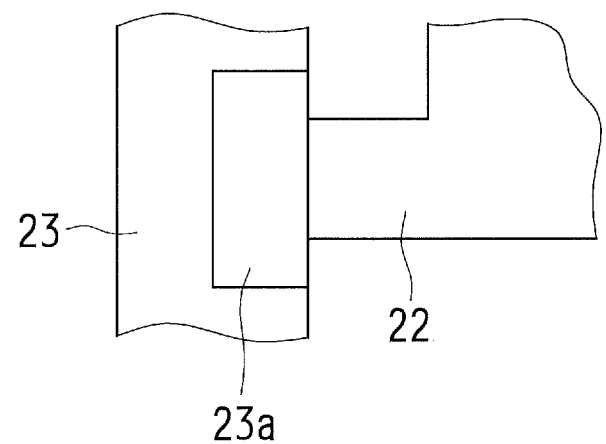
[FIGS. 19]
Figure 19:
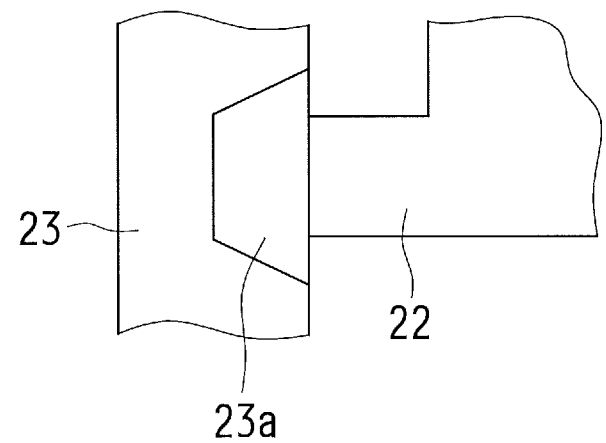

Also, in FIGS. 17 and 18, the recessed part 23a has a fan shape in plan view and the boundary between the recessed part 23a and the part other than the recessed part 23a of the external frame part 23 has a curvature. However, in the present invention, the shape of the recessed part 23a in plan view is not particularly limited. The recessed part 23a may have a rectangular shape as shown in FIG. 19(a) or a trapezoidal shape as shown in FIG. 19(b).

Method for Manufacturing Crystal Resonator Device of Third Embodiment

Next, a method for manufacturing the crystal resonator plate 2 of the crystal resonator device according to the third embodiment is described. The method for manufacturing the crystal resonator device in the third embodiment merely differs from the first embodiment in etching processes for forming the vibrating part 21, the holding part 22 and the external frame part 23 in the crystal plate. Thus, only such etching processes are described. Note that the following description is based on the configuration in which the mesa structure 213 is formed on the center of the vibrating part 21 (see FIG. 6A).

In order to make the crystal resonator plate 2 of this embodiment, a rectangular-shaped crystal plate is subjected to three etching processes (etching for forming an external form, etching for forming a mesa and etching for frequency adjustment), thus the vibrating part 21, the holding part 22 and the external frame part 23 are formed.

Figure 20:
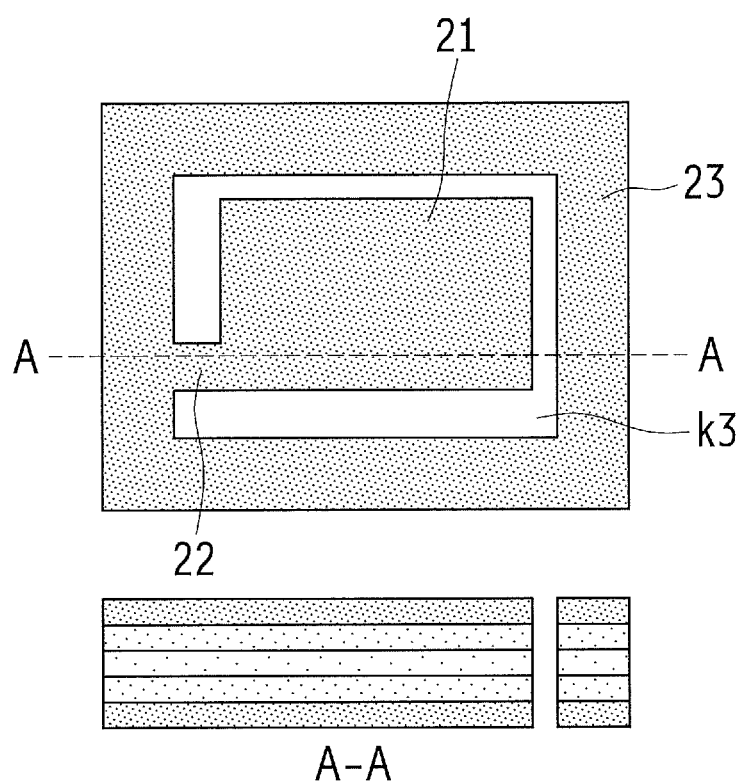
FIG. 20 is a diagram showing the crystal plate. The upper portion is a plan view showing the crystal plate after it is subjected to an etching for forming an external form. The lower portion is a cross-sectional view taken from line A-A of the upper portion.

FIG. 20 is a diagram showing the crystal plate. The upper portion is a plan view showing the crystal plate after it is subjected to the etching for forming an external form. The lower portion is a cross-sectional view taken from line A-A of the upper portion. In the etching for forming the external form, a cut-out part k3 is formed in a rectangular-shaped crystal plate so as to form the external form of the vibrating part 21, the holding part 22 and the external frame part 23.

Figure 21A:
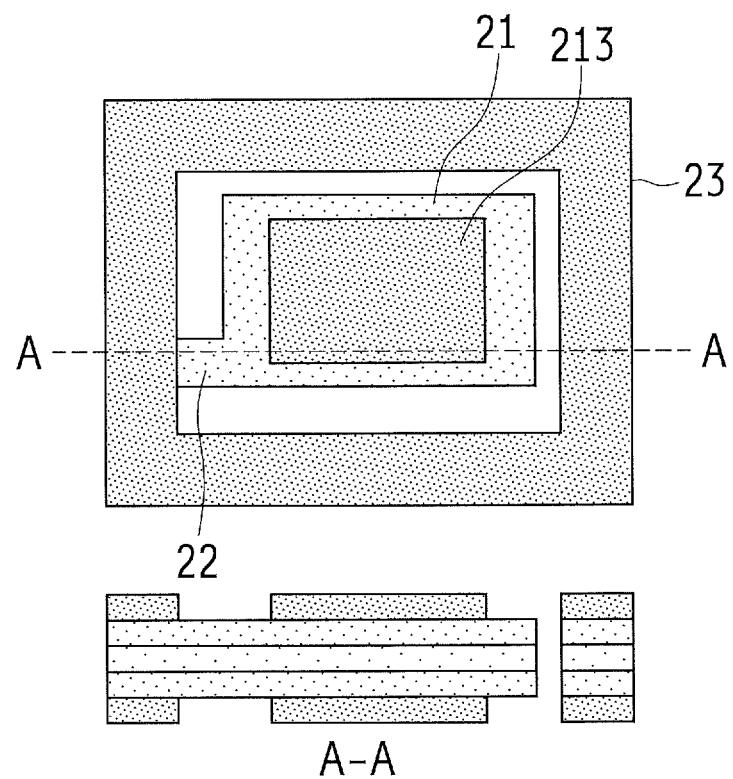
FIG. 21A is a diagram showing the crystal plate. The upper portion is a plan view showing the crystal plate after it is subjected to an etching for forming a mesa. The lower portion is a cross-sectional view taken from line A-A of the upper portion.
Figure 21B:
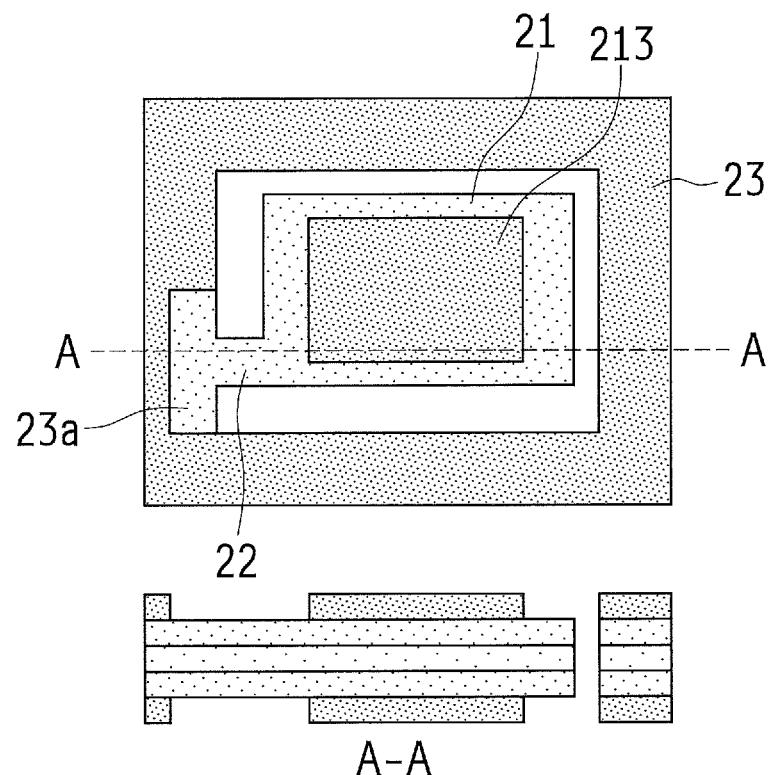
FIG. 21B is a diagram showing the crystal plate. The upper portion is a plan view showing the crystal plate after it is subjected to an etching for forming a mesa. The lower portion is a cross-sectional view taken from line A-A of the upper portion.

FIGS. 21A and 21B are diagrams each showing the crystal plate. In each diagram, the upper portion is a plan view showing the crystal plate in FIG. 20 after it is subjected to the etching for forming a mesa. The lower portion is a cross-sectional view taken from line A-A of the upper portion. FIGS. 21A and 21B show the crystal plates that are subjected to respective etchings using different masks. That is, there is a difference in the etched region.

The etching for forming a mesa is an etching process for forming an external form of the mesa structure 213 on the center of the vibrating part 21. The etching for forming the mesa is to etch at least the region of the vibrating part 21 other than the mesa structure 213 and the region of the holding part 22. In the crystal plate shown in FIG. 21A, only the region of the vibrating part 21 (except the mesa structure 213) and the region of the holding part 22 are etched. In the crystal plate shown in FIG. 21B, the region of the recessed part 23a is also etched in addition to the above regions.

Figure 22A:
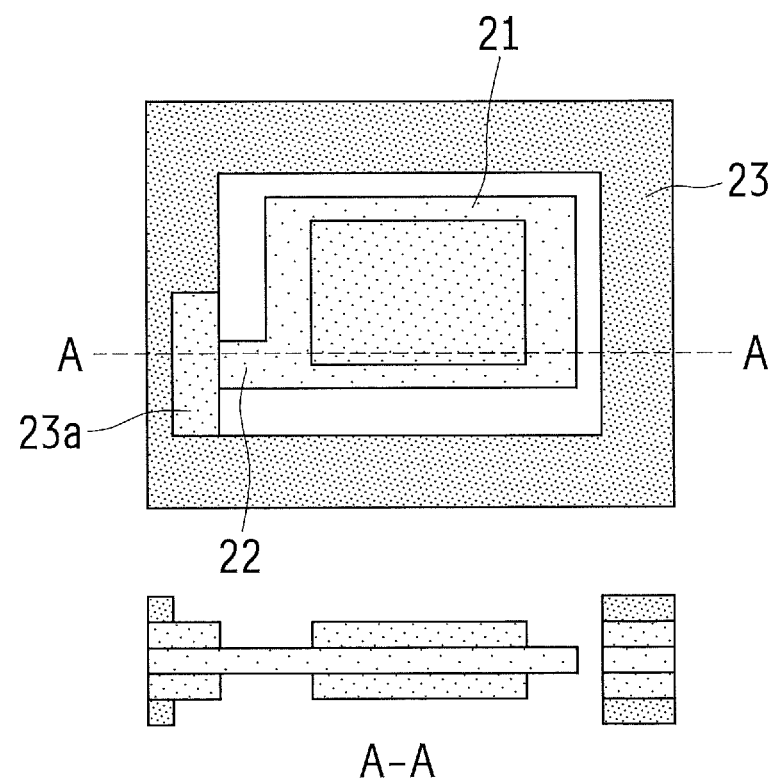
FIG. 22A is a diagram showing the crystal plate. The upper portion is a plan view showing the crystal plate after it is subjected to an etching for frequency adjustment. The lower portion is a cross-sectional view taken from line A-A of the upper portion.
Figure 22B:
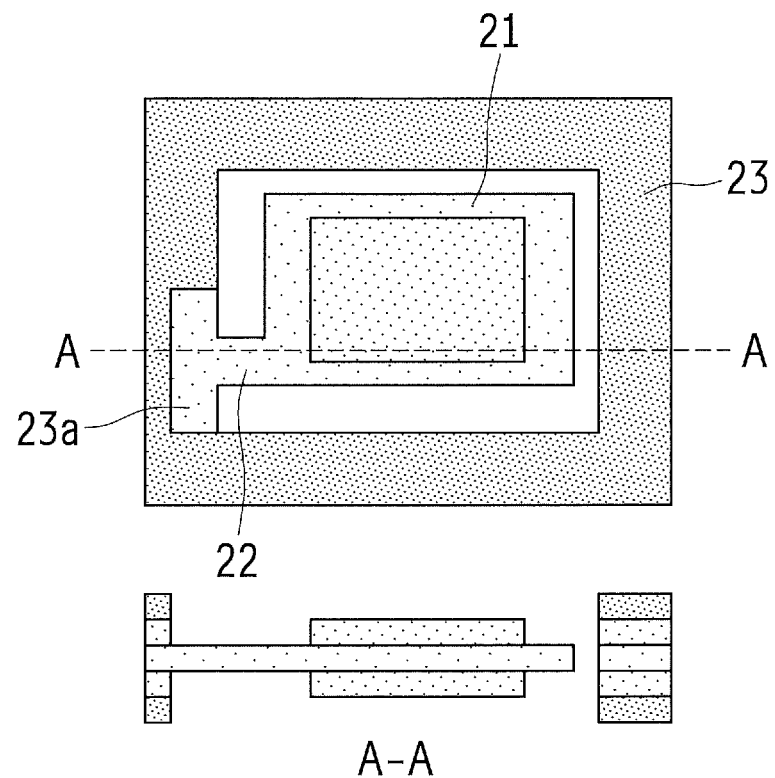
FIG. 22B is a diagram showing the crystal plate. The upper portion is a plan view showing the crystal plate after it is subjected to an etching for frequency adjustment. The lower portion is a cross-sectional view taken from line A-A of the upper portion.
Figure 23:
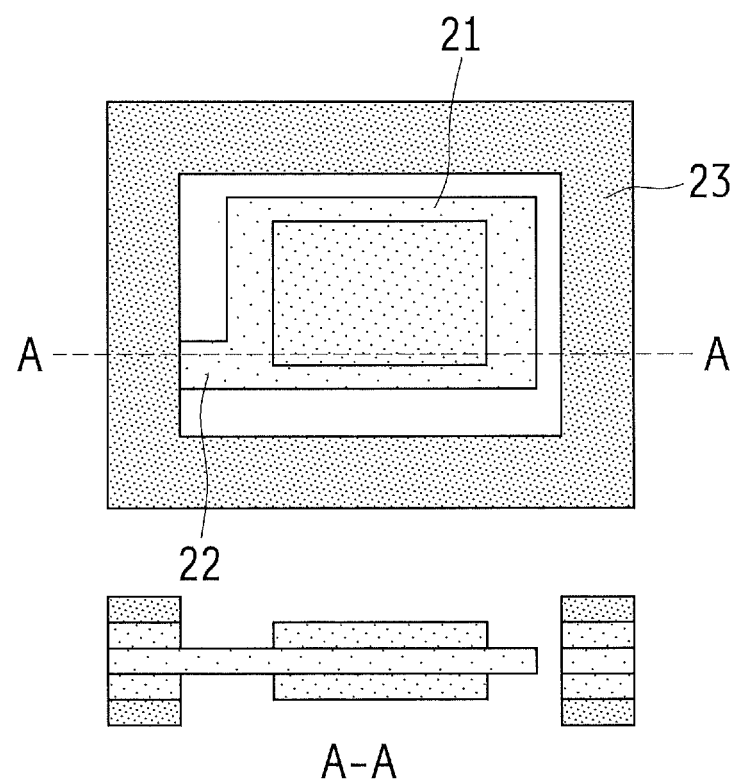
FIG. 23 is a diagram showing the crystal plate. The upper portion is a plan view showing the crystal plate after it is subjected to an etching for frequency adjustment. The lower portion is a cross-sectional view taken from line A-A of the upper portion.

FIGS. 22A 22B and 23 are diagrams showing the respective crystal plates. In each diagram, the upper portion is a plan view showing the crystal plate after it is subjected to the etching for frequency adjustment. The lower portion is a cross-sectional view taken from line A-A of the upper portion. In FIGS. 22A, 22B and 23, what is different is the state of the crystal plate before being subjected to the etching for frequency adjustment, or a mask used for etching.

The etching for frequency adjustment is an etching process for adjusting the respective thicknesses of the vibrating part 21 and the holding part 22 so that the oscillation frequency of the crystal resonator device is a predetermined value. The etching for frequency adjustment is to etch at least the region of the vibrating part 21 (i.e. entire region including the mesa structure 213) and the region of the holding part 22.

The crystal plate shown in FIG. 22A is formed by etching the respective regions of the vibrating part 21, the holding part 22 and the recessed part 23a of the crystal plate shown in FIG. 21A, or by etching the respective regions of the vibrating part 21 and the holding part 22 of the crystal plate shown in FIG. 21B. That is, in the crystal plate shown in FIG. 22A, the holding part 22 is subjected to two etching processes (i.e. the etching for forming a mesa and the etching for frequency adjustment) while the recessed part 23a is subjected to one etching process (i.e. either of the etching for forming a mesa or the etching for frequency adjustment). Thus, the crystal resonator plate 2, which has a step between the bottom surface of the recessed part 23a and the surface of the holding part 22, is formed as shown in FIG. 18(c).

In FIGS. 21A, 21B, 22A and 22B, the etched depth by the etching for forming a mesa and the etched depth by the etching for frequency adjustment are substantially the same. However, if the etched depths of these etchings differ from each other, the depth of the recessed part 23a can be adjusted by choosing a suitable etching process for forming the recessed part 23a.

The crystal plate shown in FIG. 22B is formed by etching the respective regions of the vibrating part 21, the holding part 22 and the recessed part 23a of the crystal plate shown in FIG. 21B. That is, in the crystal plate shown in FIG. 22B, both the holding part 22 and the recessed part 23a are subjected to two etching processes (i.e. etching for forming a mesa and etching for frequency adjustment). Thus, the crystal resonator plate 2, in which the bottom surface of the recessed part 23a is the same surface as the surface of the holding part 22, is formed as shown in FIG. 18(b).

The crystal plate shown in FIG. 23 is formed by etching the respective regions of the vibrating part 21 and the holding part 22 of the crystal plate shown in FIG. 21A, and there is no recessed part 23a in this crystal plate. That is, in order to obtain the crystal pate having the recessed part 23a or not having the recessed part 23a, it is sufficient to change the mask used for the etching. The number of etching processes is not changed. For this reason, in the crystal resonator device according to this embodiment, it is possible to manufacture the crystal resonator plate 2 having the recessed part 23a without subjecting it to any additional manufacturing process.

Functions and Effects of Crystal Resonator Device of Third Embodiment

In the case where the crystal resonator device to which the present invention is applied has a configuration not having the recessed part 23a in the external frame part 23 as shown in FIG. 18(a), stress may be concentrated on the stepped edge of the connecting part of the external frame part 23 and the holding part 22 when an impact or the like acts on the crystal resonator device, which may result in snap of the connecting part.

In contrast, in the configuration as shown in FIG. 18(b), the external frame part 23 is provided with the recessed part 23a so as to have no step at the connecting part of the external frame part 23 and the holding part 22. Thus, it is possible to avoid the stress concentration at the connecting part, which leads to improvement in shock resistance of the crystal resonator device.

Also, in the configuration as shown in FIG. 18(c), the step remains at the connecting part of the external frame part 23 and the holding part 22. However, since the external frame part 23 is provided with the recessed part 23a, the external frame part 23 itself also has a step at the boundary between the region where the recessed part 23a is formed and the other region (hereinafter referred to as "recessed part edge"). In this way, when an impact or the like acts on the crystal resonator device, the stress is distributed to the above two step parts. As a result, it is possible to relax the stress concentration at the connecting part of the external frame part 23 and the holding part 22, which leads to improvement in shock resistance of the crystal resonator device.

Apart from the improvement in shock resistance of the crystal resonator device, in the configuration in which the external frame part 23 is provided with the recessed part 23a, it can be expected that vibration leakage from the vibrating part 21 to the external frame part 23 is suppressed. It is ideal that the piezoelectric vibration is confined in the vibrating part 21, however, it is difficult to completely confine the vibration. Actually, the vibration leaks to the external frame part 23 to some extent. Especially, in the configuration described in this embodiment, the vibration leakage exerts a marked influence because the vibrating part 21, the holding part 22 and the external frame part 23 are integrally formed as the crystal plate. Specifically, the vibration that leaks from the vibrating part 21 may pass through the holding part 22 to reach the external frame part 23. However, if the recessed part 23a is disposed in the position where the vibration leaks from the holding part 22 to the external frame part 23, it is possible to adjust the vibration leakage to prevent resonance with the frame body, thus the vibration is not likely to be transmitted to the external frame part 23.

In particular, in the configuration of the present invention, the holding part 22 is protruded from the vibrating part 21 in the Z' direction, as described in the first embodiment. This is a configuration in which the holding part 22 is protruded in the direction perpendicular to the displacement direction of the vibration of the AT-cut crystal resonator, so that the vibration leakage is prevented. Ideally, the vibration of the AT-cut crystal resonator is confined in the vibrating part 21. However, actually, the vibration leaks to some extent as a secondary vibration that is another vibration mode, and the holding part 22 protruding in the Z' direction is likely to transmit the above vibration leakage to the external frame part 23, which causes CI variation or frequency variation. For this reason, the recessed part 23a is disposed, which suppresses the vibration leakage to the external frame part 23. Thus, it is possible to obtain further stable characteristics.

Hereinafter, other preferable examples of the crystal resonator device according to this embodiment will be described. For example, the width D1 of the recessed part 23a is preferably larger than the width D2 of the holding part 22 (see FIG. 17). Here, the width direction means the direction orthogonal to the protruding direction of the holding part 22 from the external frame part 23 in plan view. The reasons why the above configuration is preferable are described below.

First, from the viewpoint of stress relaxation, when the holding part 22 is flexed by vibration of the vibrating part 21 caused by an impact or the like on the crystal resonator device, the recessed part edge of the recessed part 23a serves as the stress concentration point. As the recessed part edge is spaced apart from the vibrating part 21, the piezoelectric vibration is not likely to be affected. Also, as the recessed part edge becomes longer, the effect of the stress distribution becomes higher. Thus, the configuration in which the width D1 of the recessed part 23a is larger than the width D2 of the holding part 22 leads to the longer recessed part edge, accordingly, the effect of the stress distribution caused by the recessed part 23a is improved. Second, from the viewpoint of vibration leakage suppression, the larger the recessed part 23a becomes, the higher the effect of vibration damping becomes. Thus, it can be expected that the vibration leakage to the external frame part 23 is further suppressed and that the CI value is further reduced or its variation is further suppressed.

Also, as the shape of the recessed part edge of the recessed part 23a, an arc shape as shown in FIG. 17 is preferable compared to the rectangular shape and the trapezoidal shape as shown in FIGS. 19(a) and 19(b). In other words, the shape of the recessed part edge is preferably a shape having a curvature. When the recessed part edge is formed so as to have a curvature, the recessed part edge can have a shape with no vertex in plan view. Thus, it is possible to avoid the stress concentration on the vertex.

Also, on the above description, the recessed part 23a is exemplarily shown in the configuration in which the vibrating part 21 of the crystal resonator plate is held by one holding part 22 (i.e. in the configuration of the second embodiment). However, the present invention is not limited thereto. The recessed part(s) 23a may be formed in the configuration in which the vibrating part 21 of the crystal resonator plate is held by two holding parts 22 (i.e. in the configuration of the first embodiment). Note that, in the configuration of the second embodiment, the shock resistance is lower than that of the first embodiment because of the smaller number of the holding parts 22. For this reason, the configuration of the third embodiment is preferably applied to the configuration of the second embodiment, thus the shock resistance is improved by forming the recessed part 23a.

As the foregoing embodiments and examples of the present invention are to be considered in all respects as illustrative, it is to be understood that such embodiments and examples are not intended to limit the technical scope of the present invention.

In the above embodiments, a crystal resonator is used for the crystal resonator device. However, the present invention can be applied to a crystal resonator device (e.g. crystal oscillator) other than that using the crystal resonator.

DESCRIPTION OF REFERENCE NUMERALS

1 Crystal resonator device
11 Bonding material
12 Package
13 Internal space
2 Crystal resonator plate
2a First main surface
2b Second main surface
21 Vibrating part
21a Corner part
22 Holding part
23 External frame part
23a Recessed part
211 First excitation electrode
212 Second excitation electrode
213 Mesa structure
214 First extraction electrode
215 Second extraction electrode
216 Resonator-plate-side first bonding pattern
217 Resonator-plate-side second bonding pattern
k1 Inversed U-shaped part in plan view
k2 Oblong rectangular part in plan view
3 First sealing member
3a First main surface of first sealing member
3b Second main surface of first sealing member
31 Sealing-member-side first bonding pattern
4 Second sealing member
41 Sealing-member-side second bonding pattern
42a First external electrode terminal
42b Second external electrode terminal
h1 First through hole
h2 Second through hole
h3 Third through hole
C Central part
m Groove
m1 First groove
m2 Second groove

The invention claimed is:

1. An AT-cut crystal resonator plate including a first main surface on which a first excitation electrode is formed and a second main surface on which a second excitation electrode is formed, comprising:
   a substantially rectangular-shaped vibrating part having the first excitation electrode and the second excitation electrode;
   a holding part protruding from a corner part of the vibrating part in a direction parallel to a Z' axis direction of the AT-cut crystal so as to hold the vibrating part; and
   an external frame part configured to surround an external circumference of the vibrating part and to hold the holding part.

2. The crystal resonator plate according to claim 1, wherein the first excitation electrode and the second excitation electrode are each formed at a position spaced apart from a region on an extended line of the holding part in the Z' axis direction toward a central direction of the vibrating part.

3. The crystal resonator plate according to claim 1, wherein the holding part is protruded toward the external frame part from each of two corner parts disposed in the vibrating part in the Z' axis direction.

4. The crystal resonator plate according to claim 1, wherein the holding part is protruded toward the external frame part from one corner part disposed in the vibrating part.

5. The crystal resonator plate according to claim 1, wherein the external frame part has a thickness larger than a thickness of the holding part.

6. The crystal resonator plate according to claim 1, wherein a mesa structure is formed at a position of the vibrating part, the position on which the first excitation electrode and the second excitation electrode are formed, so that a central region of the vibrating part is thicker than a region surrounding the central region.

7. The crystal resonator plate according to claim 1,
wherein the external frame part includes a recessed part that is disposed at a position to be connected to the holding part in at least one of the first main surface and the second main surface, and
wherein respective thicknesses of the external frame part, the recessed part and the holding part have a relation represented by the following expression: (thickness of the external frame part)>(thickness of the recessed part)>=(thickness of the holding part).

8. The crystal resonator plate according to claim 7, wherein the recessed part is formed in each of the first main surface and the second main surface.

9. The crystal resonator plate according to claim 7, wherein a bottom surface of the recessed part is formed so as to be a same surface as a surface of the holding part.

10. The crystal resonator plate according to claim 7,
wherein a bottom surface of the recessed part is formed so that there is a step between the bottom surface of the recessed part and a surface of the holding part.

11. The crystal resonator plate according to claim 7,
wherein, when a width direction is set to a direction orthogonal to the protruding direction of the holding part from the external frame part, viewing from a direction perpendicular to the main surface of the external frame part, a width of the recessed part is larger than a width of the holding part.

12. The crystal resonator plate according to claim 7,
wherein an interior wall surface of the recessed part has a curvature when viewed from a direction perpendicular to a main surface of the external frame part.

13. A crystal resonator device comprising:
the crystal resonator plate according to claim 1, a first sealing member covering the first main surface of the crystal resonator plate; and a second sealing member covering the second main surface of the crystal resonator plate.

14. An AT-cut crystal resonator plate including a first main surface on which a first excitation electrode is formed and a second main surface on which a second excitation electrode is formed, comprising:
a substantially rectangular-shaped vibrating part having the first excitation electrode and the second excitation electrode;
a holding part protruding from a corner part of the vibrating part in a Z' axis direction of the AT-cut crystal so as to hold the vibrating part; and an external frame part configured to surround an external circumference of the vibrating part and to hold the holding part,
wherein at least one groove is disposed in at least one of the vibrating part and the holding part, and
wherein the at least one groove is inclined toward a central part of the vibrating part relative to an X axis direction of the AT-cut crystal.

15. The crystal resonator plate according to claim 14, wherein the at least one groove is constituted by: one or more first grooves formed in the first main surface of the vibrating part; and
one or more second grooves formed in the second main surface of the vibrating part, and
wherein the one or more first grooves and the one or more second grooves are alternately arranged in the vibrating part, from a side of the vibrating part to a side of the external frame part.

16. An AT-cut crystal resonator plate including a first main surface on which a first excitation electrode is formed and a second main surface on which a second excitation electrode is formed, comprising:
a substantially rectangular-shaped vibrating part having the first excitation electrode and the second excitation electrode;
a holding part protruding from a corner part of the vibrating part in a Z' axis direction of the AT-cut crystal so as to hold the vibrating part; and an external frame part configured to surround an external circumference of the vibrating part and to hold the holding part,
wherein the external frame part includes a recessed part that is disposed at a position to be connected to the holding part in at least one of the first main surface and the second main surface,
wherein respective thicknesses of the external frame part, the recessed part and the holding part have a relation represented by the following expression: (thickness of the external frame part)>(thickness of the recessed part)>=(thickness of the holding part), and
wherein a bottom surface of the recessed part is formed so that there is a step between the bottom surface of the recessed part and a surface of the holding part.

* * * * *